(12) United States Patent
Liu

(10) Patent No.: US 12,713,903 B2
(45) Date of Patent: Aug. 18, 2026

(54) METHOD OF MANUFACTURING SEMICONDUCTOR STRUCTURE AND SEMICONDUCTOR STRUCTURE THEREOF

(71) Applicant: TAIWAN SEMICONDUCTOR MANUFACTURING COMPANY LTD., Hsinchu (TW)

(72) Inventor: Szu-Ling Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 501 days.

(21) Appl. No.: 18/356,250

(22) Filed: Jul. 21, 2023

(65) Prior Publication Data

US 2025/0029922 A1 Jan. 23, 2025

(51) Int. Cl.
*H10W 20/41* (2026.01)
*H10W 20/00* (2026.01)

(52) U.S. Cl.
CPC ....... *H10W 20/435* (2026.01); *H10W 20/023* (2026.01)

(58) Field of Classification Search
CPC ......... H01L 23/5283; H01L 21/76898; H10W 20/435; H10W 20/023
See application file for complete search history.

(56) References Cited

U.S. PATENT DOCUMENTS 10,504,852 B1 * 12/2019 Chen ..................... H01L 23/544
2009/0023266 A1 * 1/2009 Hatano ................. H01L 23/585 257/E21.54
2009/0206411 A1 * 8/2009 Koketsu .............. H01L 23/5226 257/E21.048
2011/0016443 A1 * 1/2011 Fu ........................... G06F 30/39 716/108
2014/0264961 A1 * 9/2014 Huang .................. H01L 23/544 257/797

(Continued)

OTHER PUBLICATIONS

Chun-Tse Tsai et al., “Layout Design Method and Structure with Enhanced Process Window”, unpublished U.S. Appl. No. 18/157,887, filed Jan. 23, 2023, which disclosure is incorporated by reference in its entirety.

(Continued)

*Primary Examiner* — Herve-Louis Y Assouman
(74) *Attorney, Agent, or Firm* — WPAT LAW; Anthony King

(57) ABSTRACT

A substrate is provided, wherein the substrate includes a device layer, and a logo region is defined in a peripheral region of the substrate. An interconnect structure is formed over the device layer. A first conductive feature and at least one second conductive feature are formed in the interconnect structure, wherein the first conductive feature is recognizable as a first identification mark, and the at least one second conductive feature is disposed between different portions of the first conductive feature. A third conductive feature is formed at a first elevation over a second elevation of the first conductive feature, wherein the third conductive feature overlaps the first conductive feature vertically and is recognizable as a second identification mark, and a space other than the third conductive feature in the logo region at the first elevation is filled with a dielectric material.

20 Claims, 22 Drawing Sheets

(56) References Cited

U.S. PATENT DOCUMENTS

2019/0067204 A1 * 2/2019 Sun ........................ G01B 21/20

OTHER PUBLICATIONS

Chun-Tse Tsai et al., “Layout Design Method and Structure with Enhanced Process Window”, U.S. Appl. No. 63/311,096, filed Feb. 17, 2022, which disclosure is incorporated by reference in its entirety.

Chun-Tse Tsai et al., “Layout Design Method and Structure with Enhanced Process Window”, U.S. Appl. No. 63/387,446, filed Dec. 14, 2022, which disclosure is incorporated by reference in its entirety.

* cited by examiner

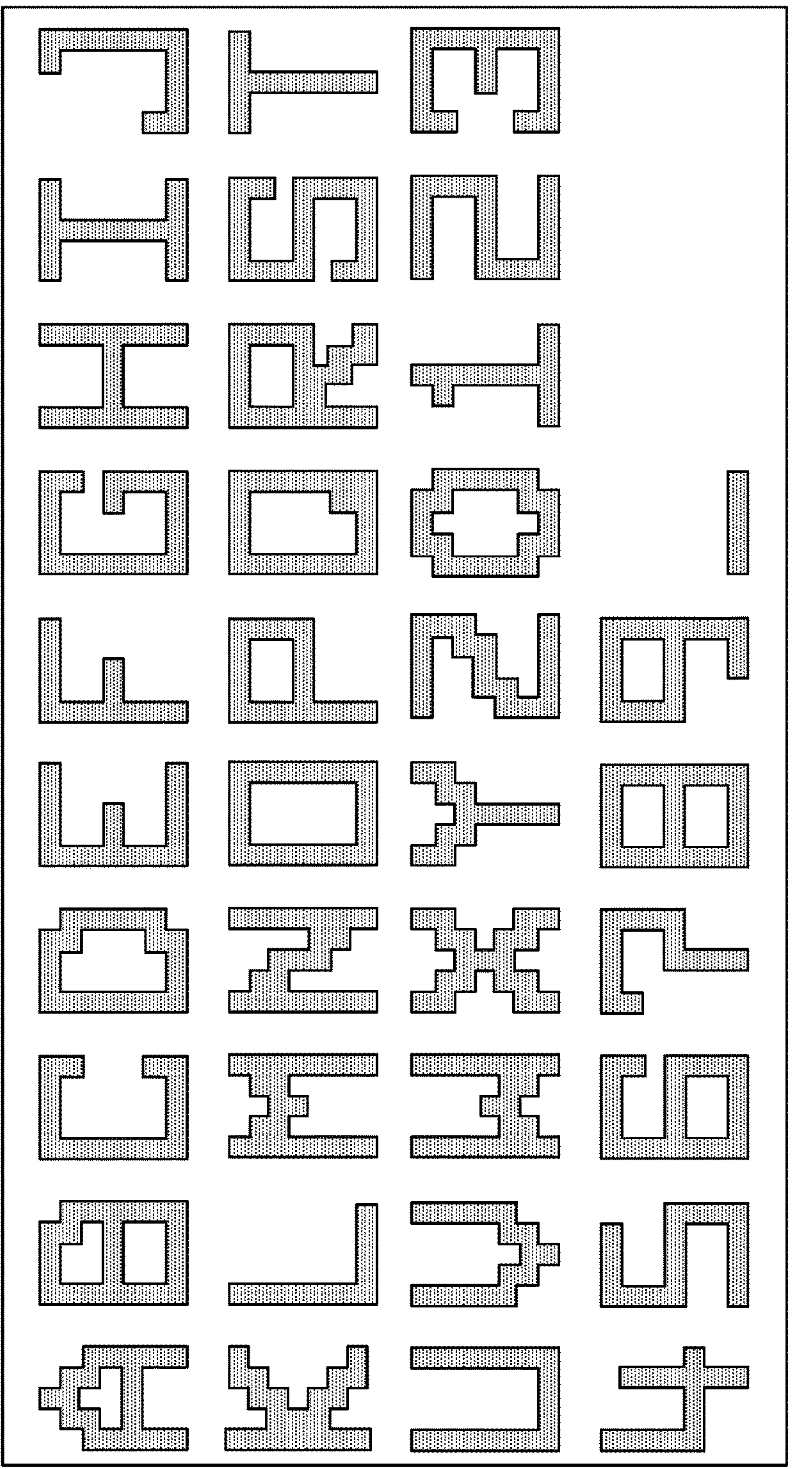
FIG. 3

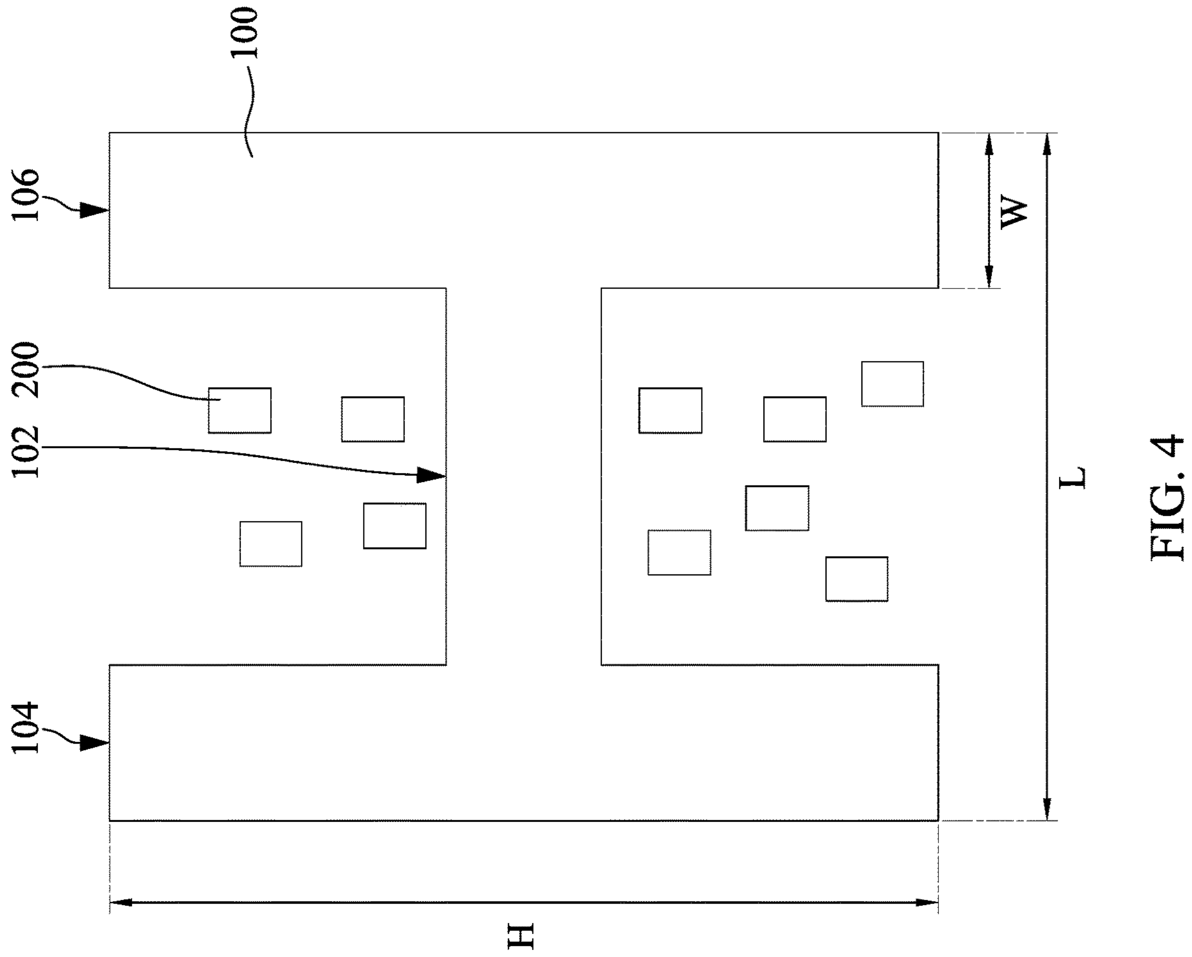
FIG. 4
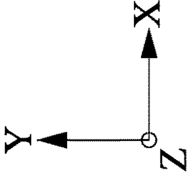

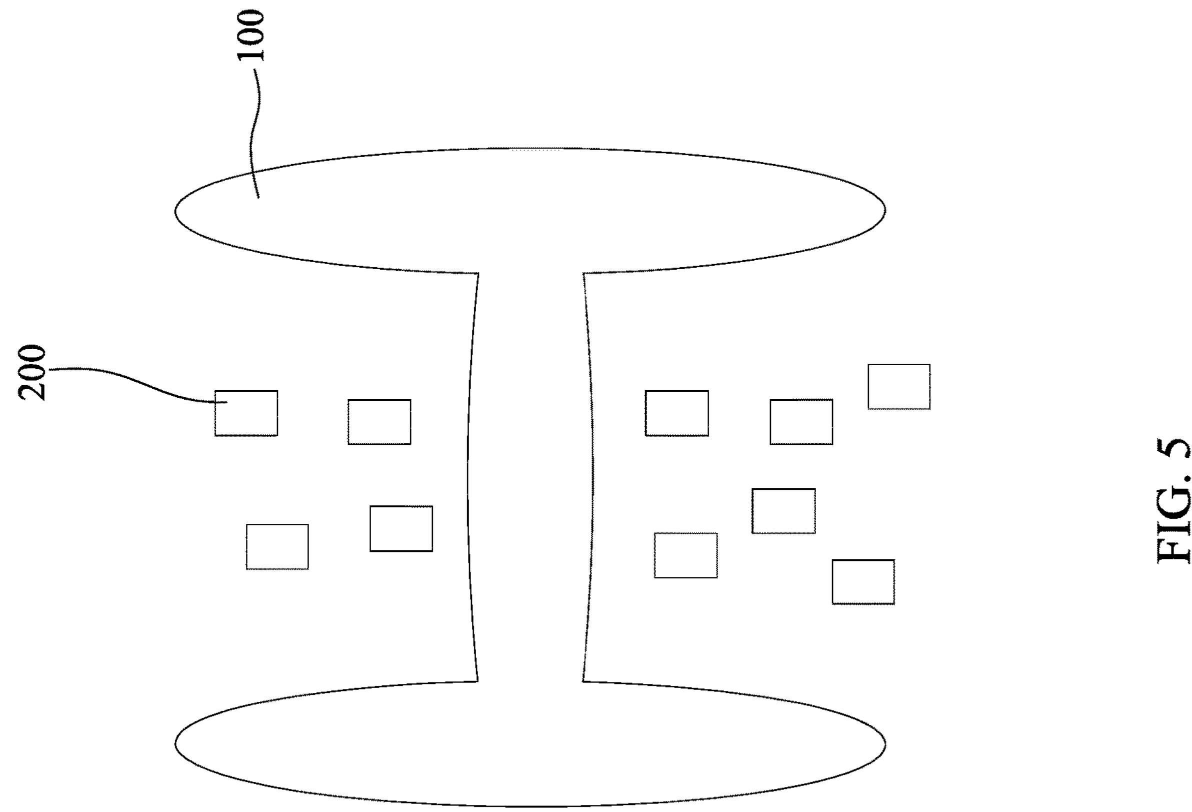
FIG. 5
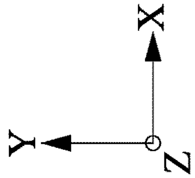

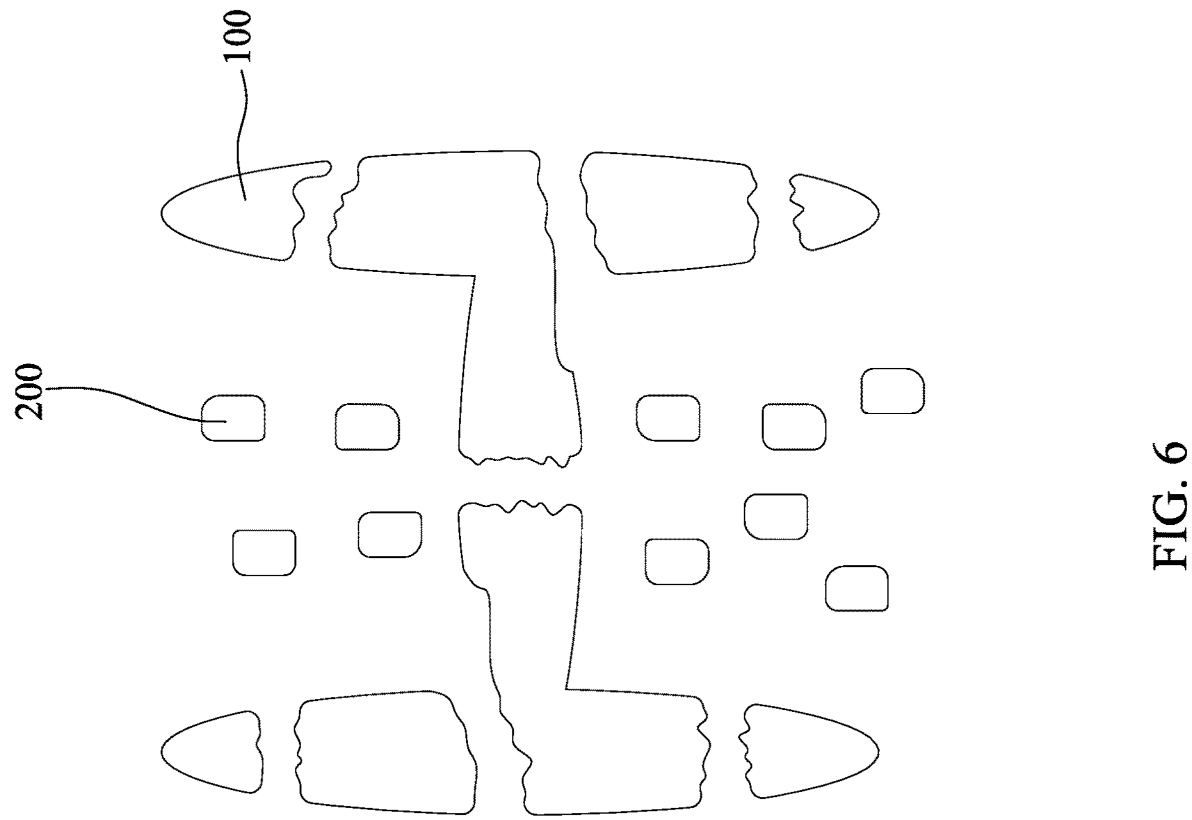
FIG. 6
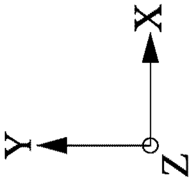

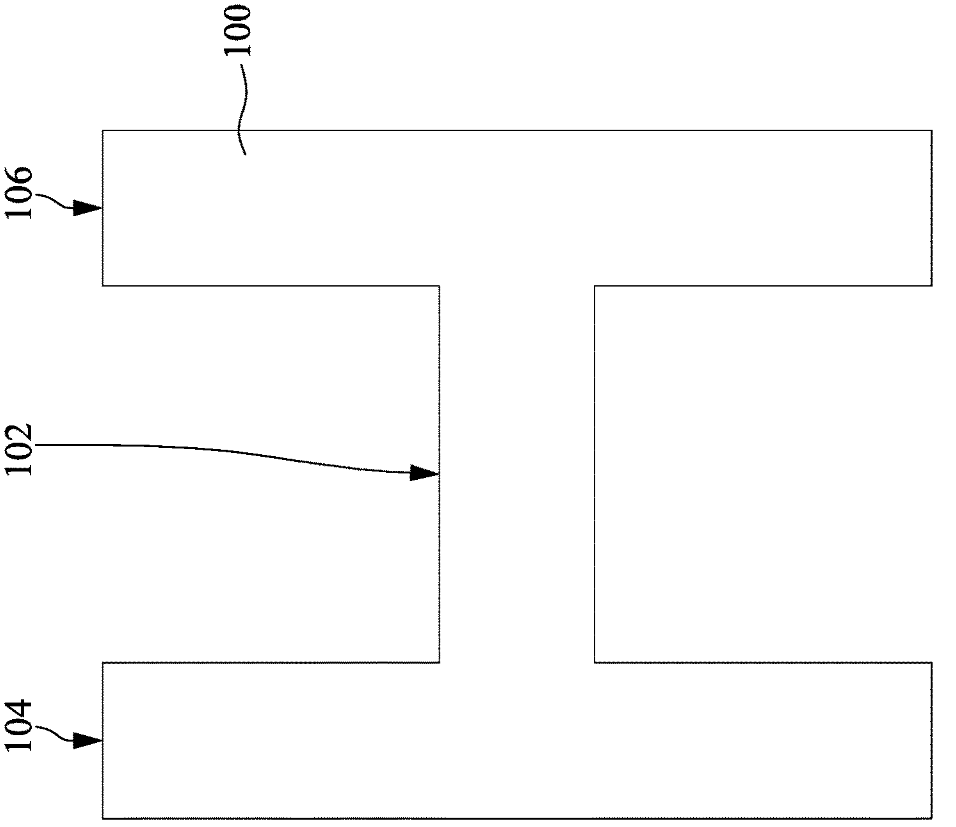
FIG. 7
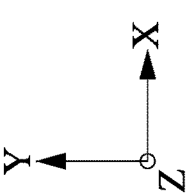

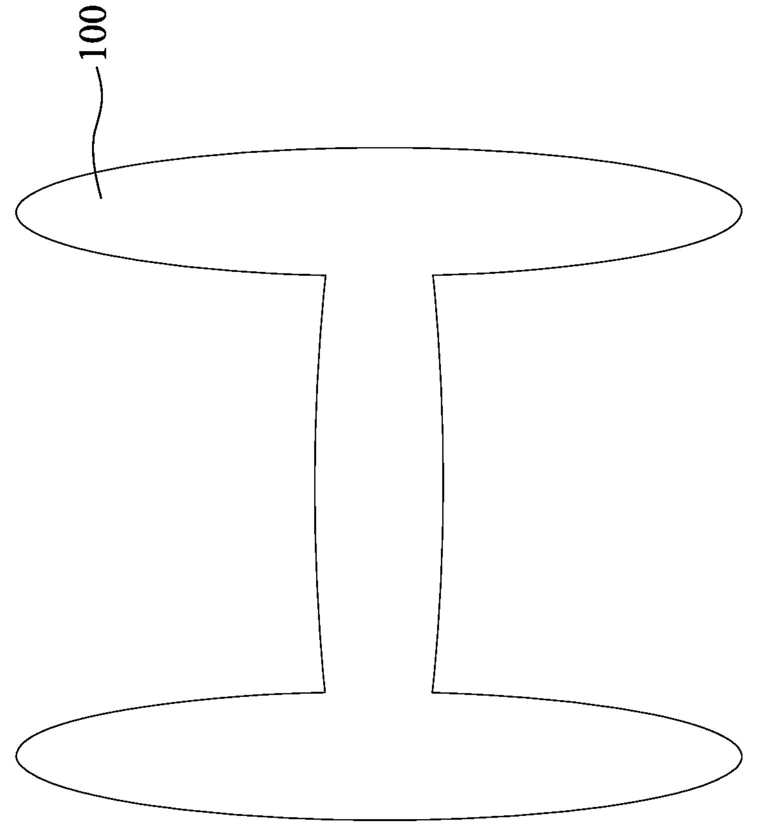
FIG. 8
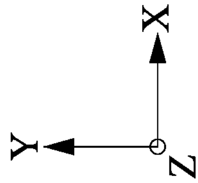

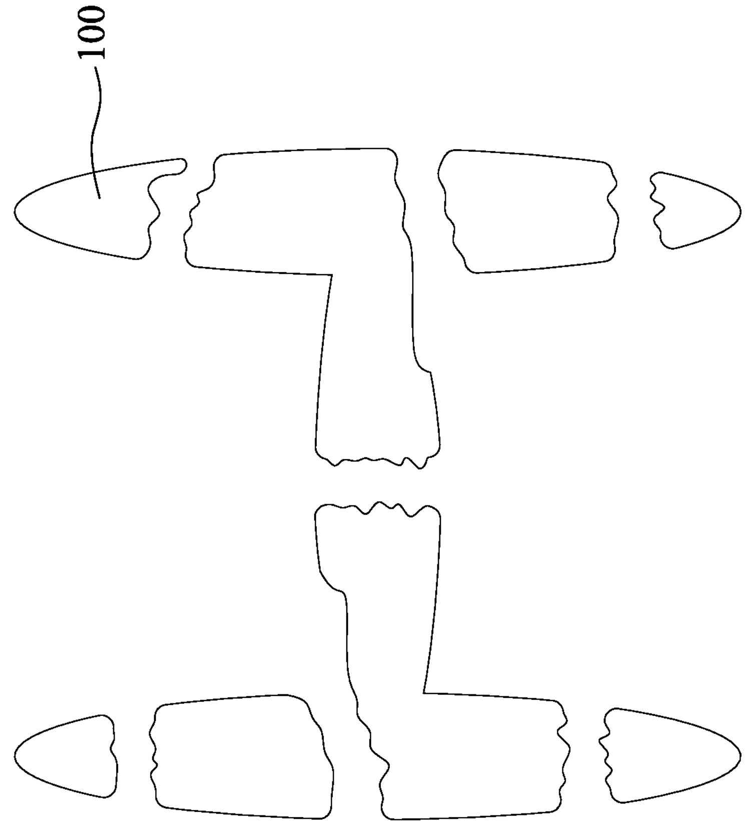
FIG. 9
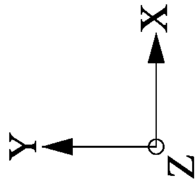

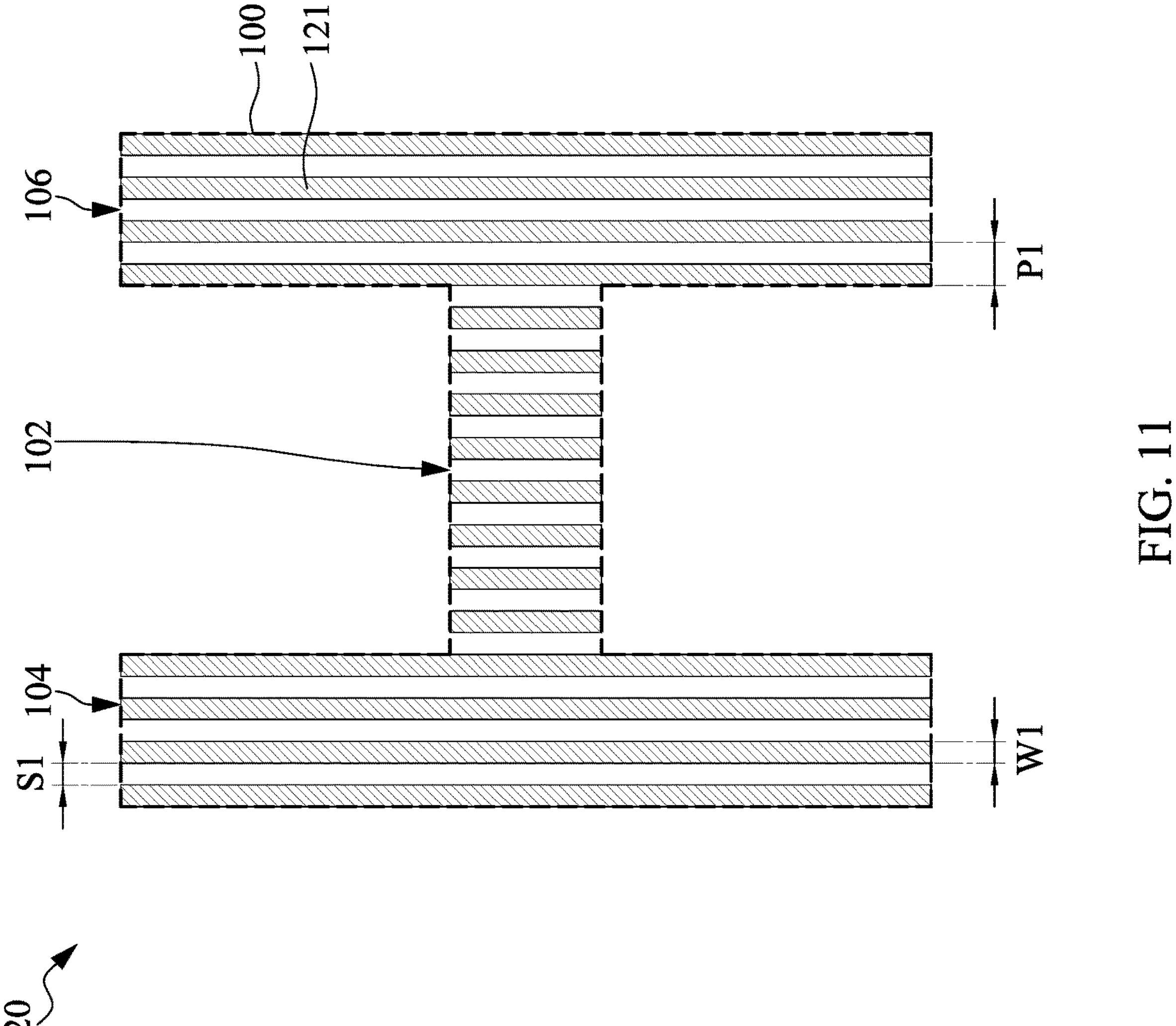
FIG. 11
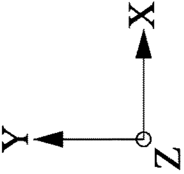

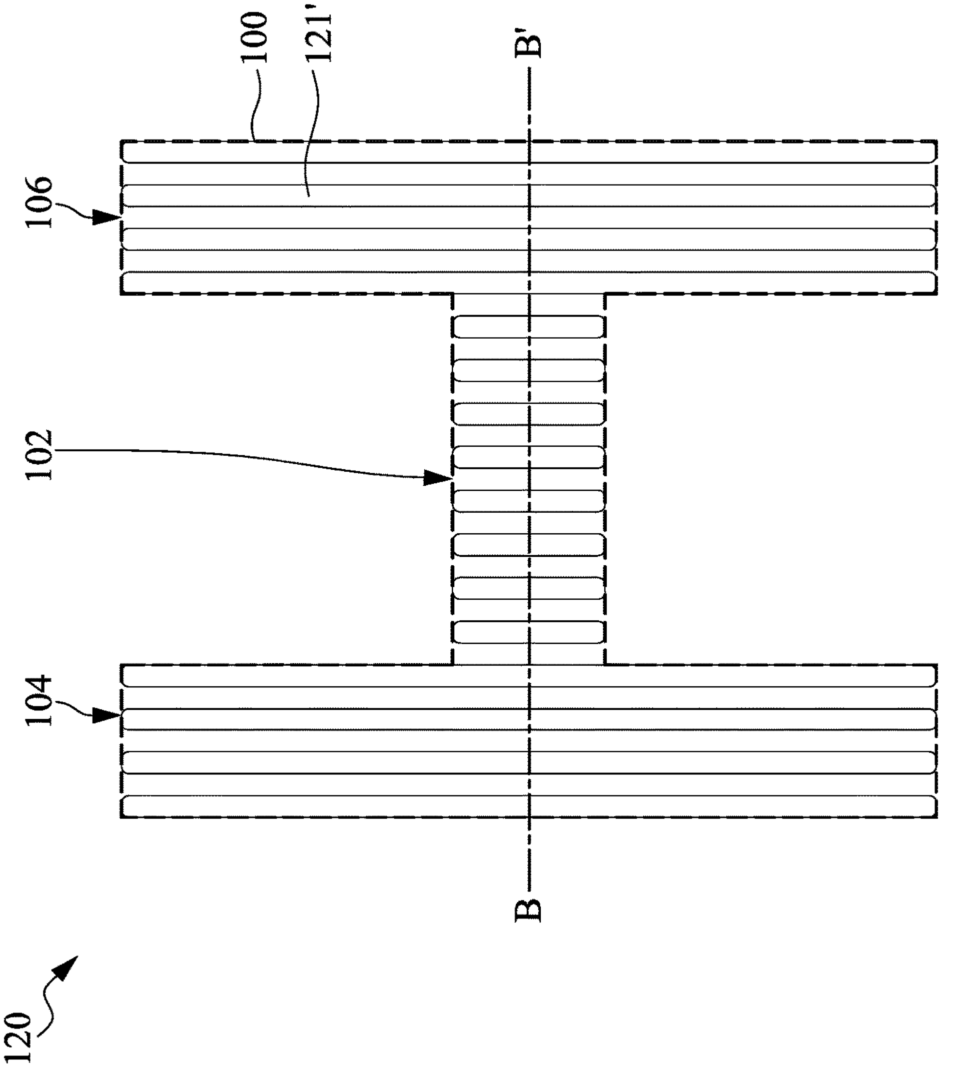
FIG. 12
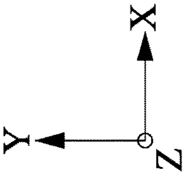

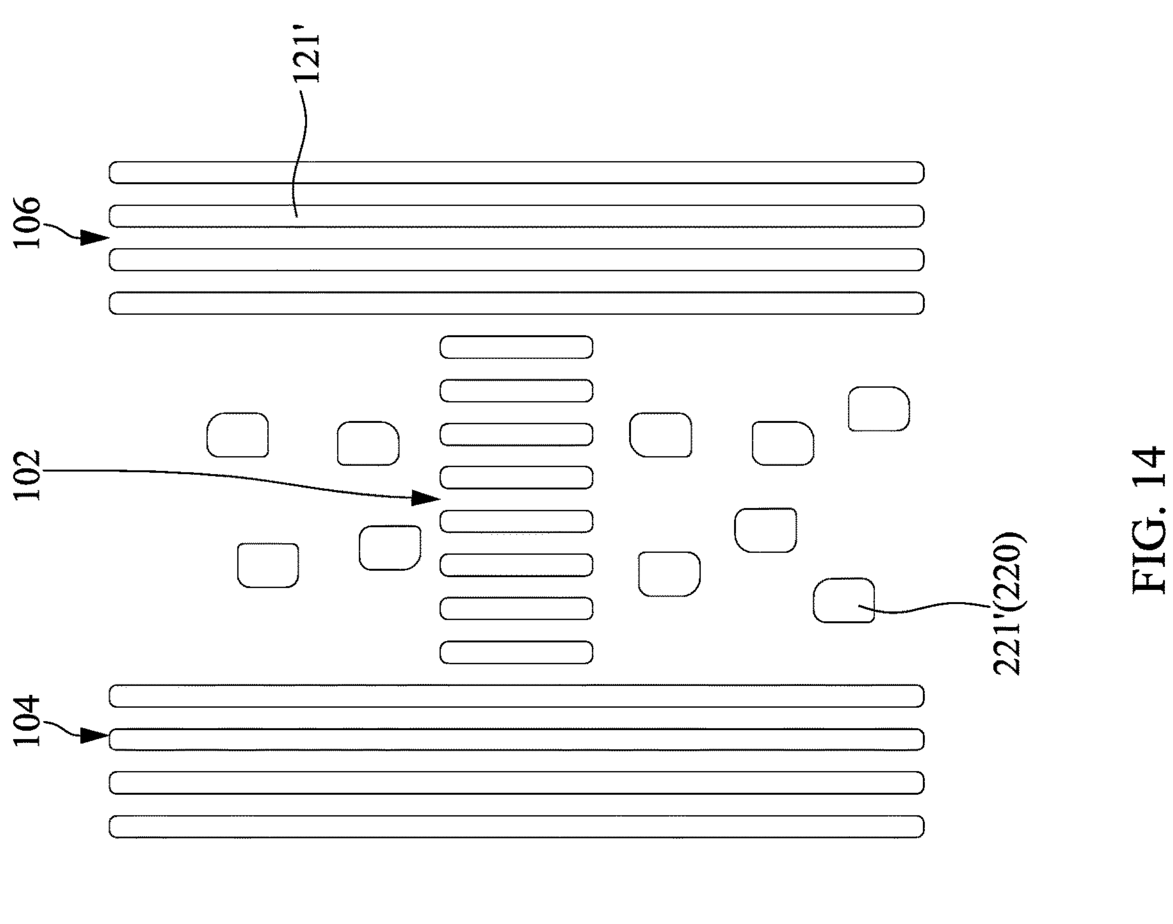
FIG. 14
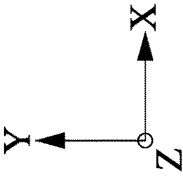

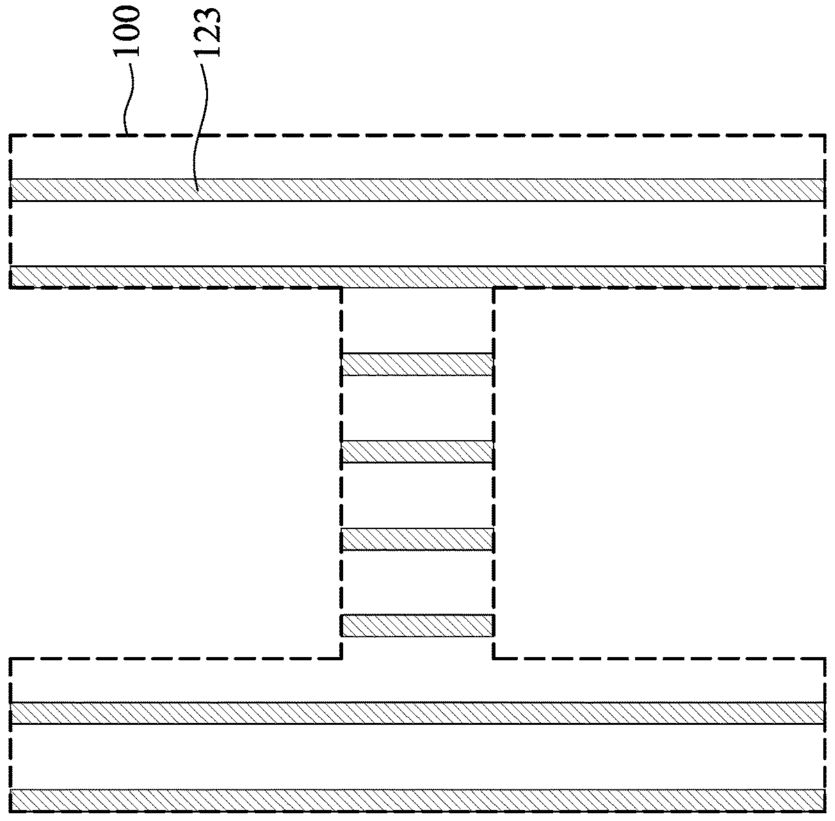
FIG. 15
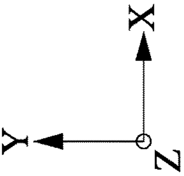

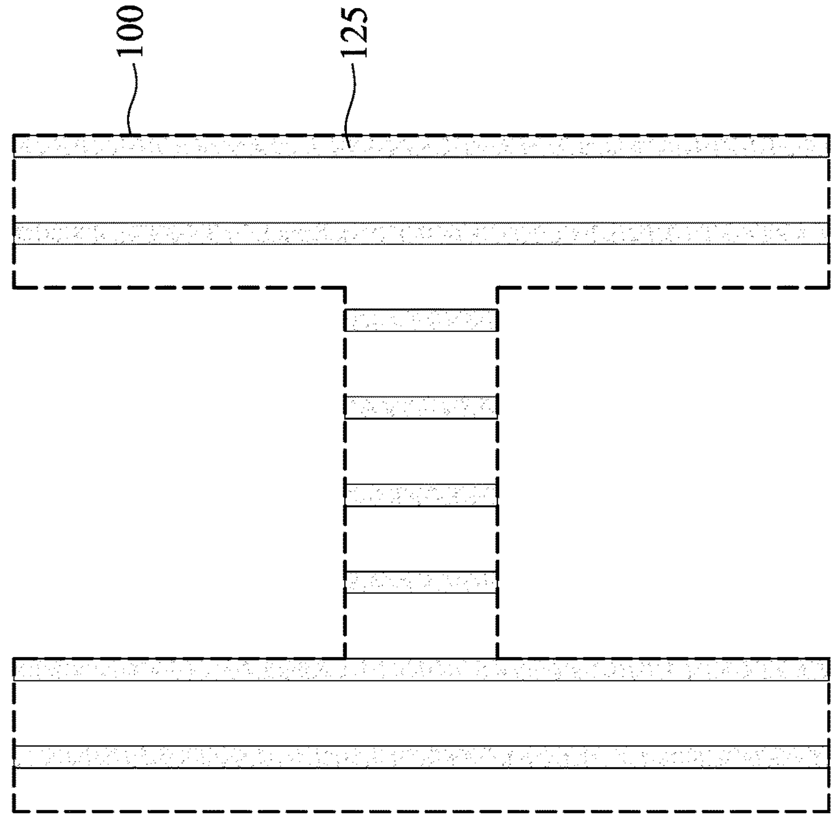
FIG. 16
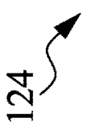
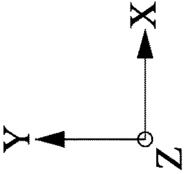

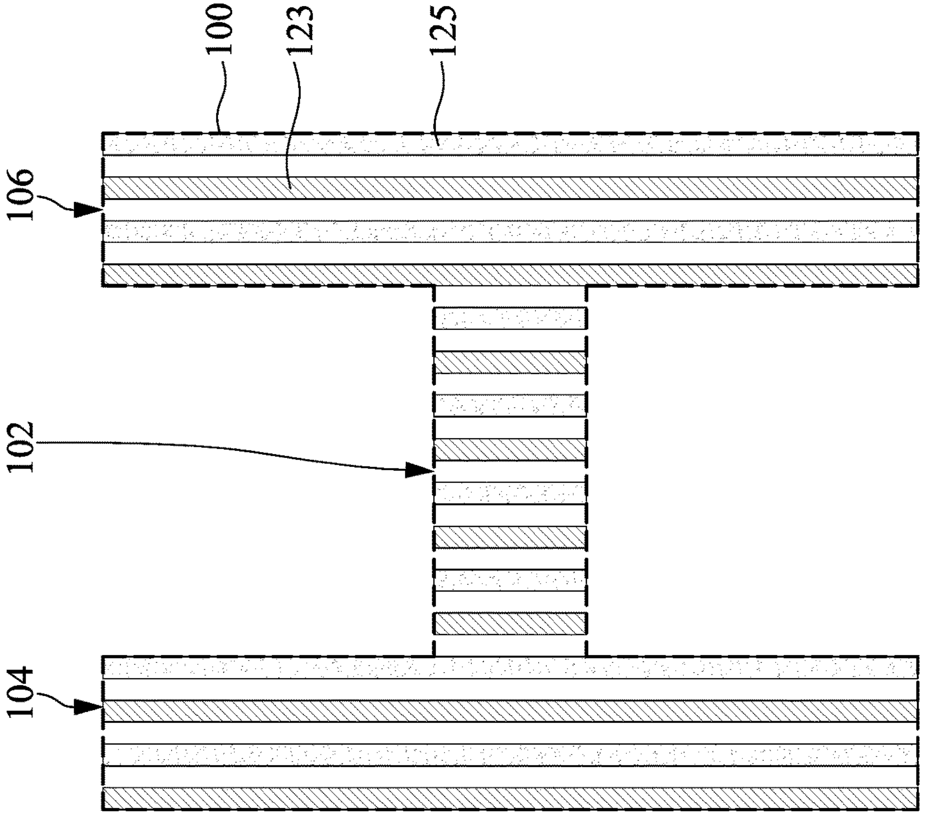
FIG. 17
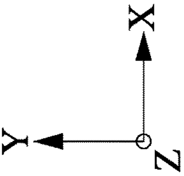

METHOD OF MANUFACTURING SEMICONDUCTOR STRUCTURE AND SEMICONDUCTOR STRUCTURE THEREOF

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes and introduced various challenges to the IC fabrication and reduced process windows. Thus, realizing continued advances in IC devices and their performance requires similar advances in IC manufacturing processes and technology.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, dimensions of the various features may be arbitrarily increased or reduced for clarity of discussion.

FIG. 3 shows a library of characters 78 in accordance with some embodiments of the disclosure.

FIG. 4 is a schematic diagram of a pattern in a logo region in accordance with some embodiments of the disclosure.

FIGS. 5 and 6 are schematic top views of patterned conductive layers according to the pattern of FIG. 4 in accordance with different embodiments of the present disclosure.

FIG. 7 is a schematic diagram of a pattern in a logo region in accordance with some embodiments of the disclosure.

FIGS. 8 and 9 are schematic top views of patterned conductive layers according to the pattern shown in FIG. 7 in accordance with different embodiments of the present disclosure.

FIG. 11 is a schematic diagram of a pattern in a logo region in accordance with some embodiments of the disclosure.

FIG. 12 is a schematic top view of a patterned conductive layer according to the pattern of FIG. 11 in accordance with different embodiments of the present disclosure.

FIG. 14 is a schematic top view of a patterned conductive layer according to 0061 mark pattern 120 in FIG. 12 and a dummy pattern in accordance with different embodiments of the present disclosure.

FIGS. 15 and 16 are schematic diagrams of patterns in logo regions of different photomasks or different circuit layouts in accordance with different embodiments of the present disclosure.

FIG. 17 is a schematic diagram of combined patterns of the patterns shown in FIGS. 15 and 16 in accordance with different embodiments of the present disclosure.

DETAILED DESCRIPTION

Figure 1:
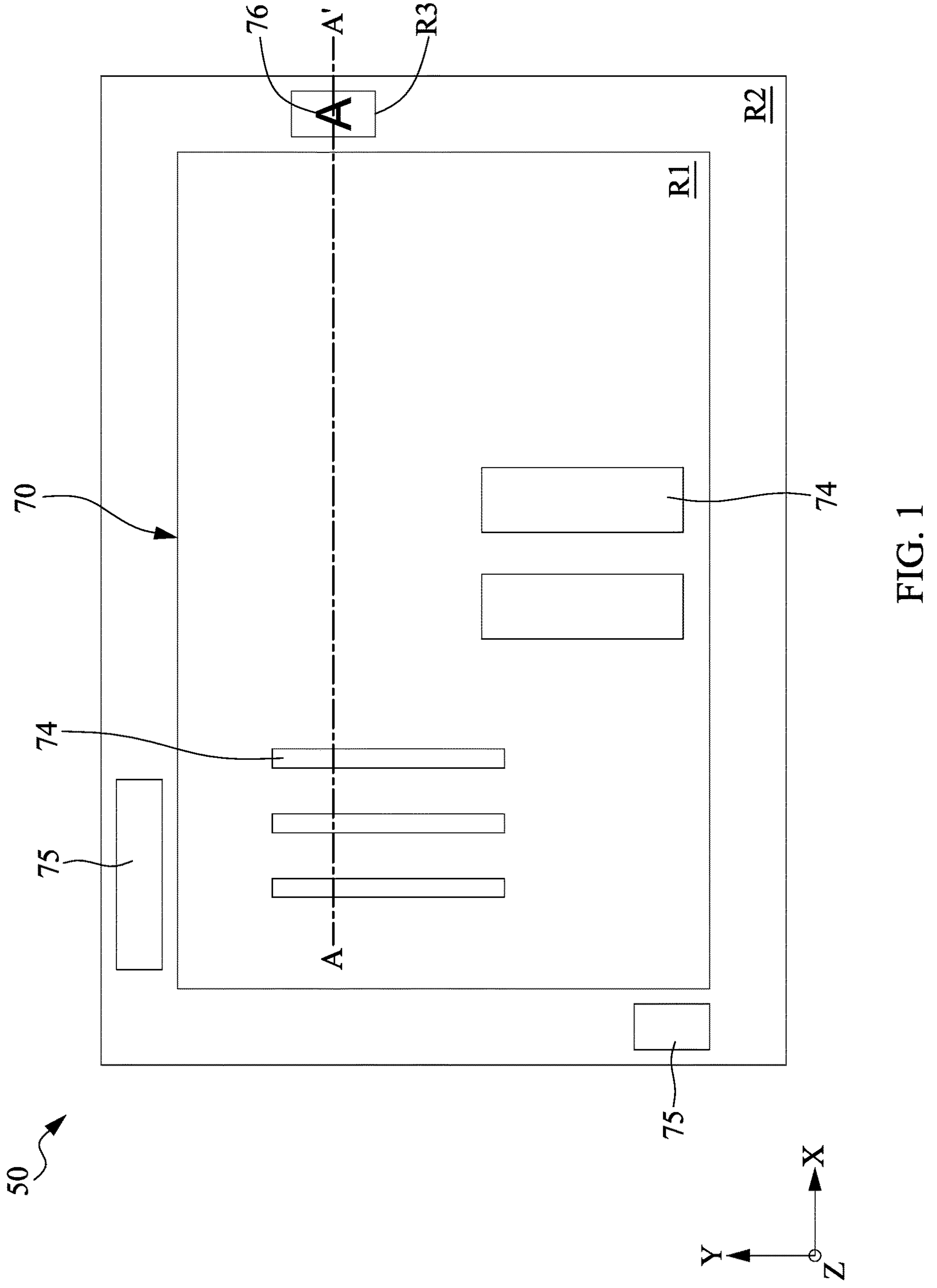
FIG. 1 is a schematic top view of a semiconductor structure in accordance with some embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context. In addition, the term "source/drain region" or "source/drain regions" may refer to a source or a drain, individually or collectively dependent upon the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from normal deviation found in the respective testing measurements. Also, as used herein, the terms "substantially." "approximately" and "about" generally mean within a value or range that can be contemplated by people having ordinary skill in the art. Alternatively, the terms "substantially." "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially." "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure relates to a semiconductor structure having an integrated circuit (IC) layout and method of fabrication of the semiconductor structure having the layout such that a designed pattern can be fabricated on a semiconductor substrate having a modified pattern with improved process window in advanced technology nodes. The method of fabricating the semiconductor structure includes fabricating the designed pattern according to the modified pattern.

The present disclosure is directed to, but not otherwise limited to, a field-effect transistor (FET) device. The FET device, for example, may be a complementary metal-oxide-semiconductor (CMOS) device including a P-type metal-oxide-semiconductor (PMOS) FET device and an N-type metal-oxide-semiconductor (NMOS) FET device. The FET may be two-dimensional (planar FET) or three-dimensional, such as a fin-type FET (FinFET), multiple gate devices, such as gate-all-around (GAA) devices. The following disclosure will continue with a FinFET example to illustrate various embodiments of the present invention. It is understood, however, that the application should not be limited to a particular type of device, except as specifically claimed.

Figure 2:
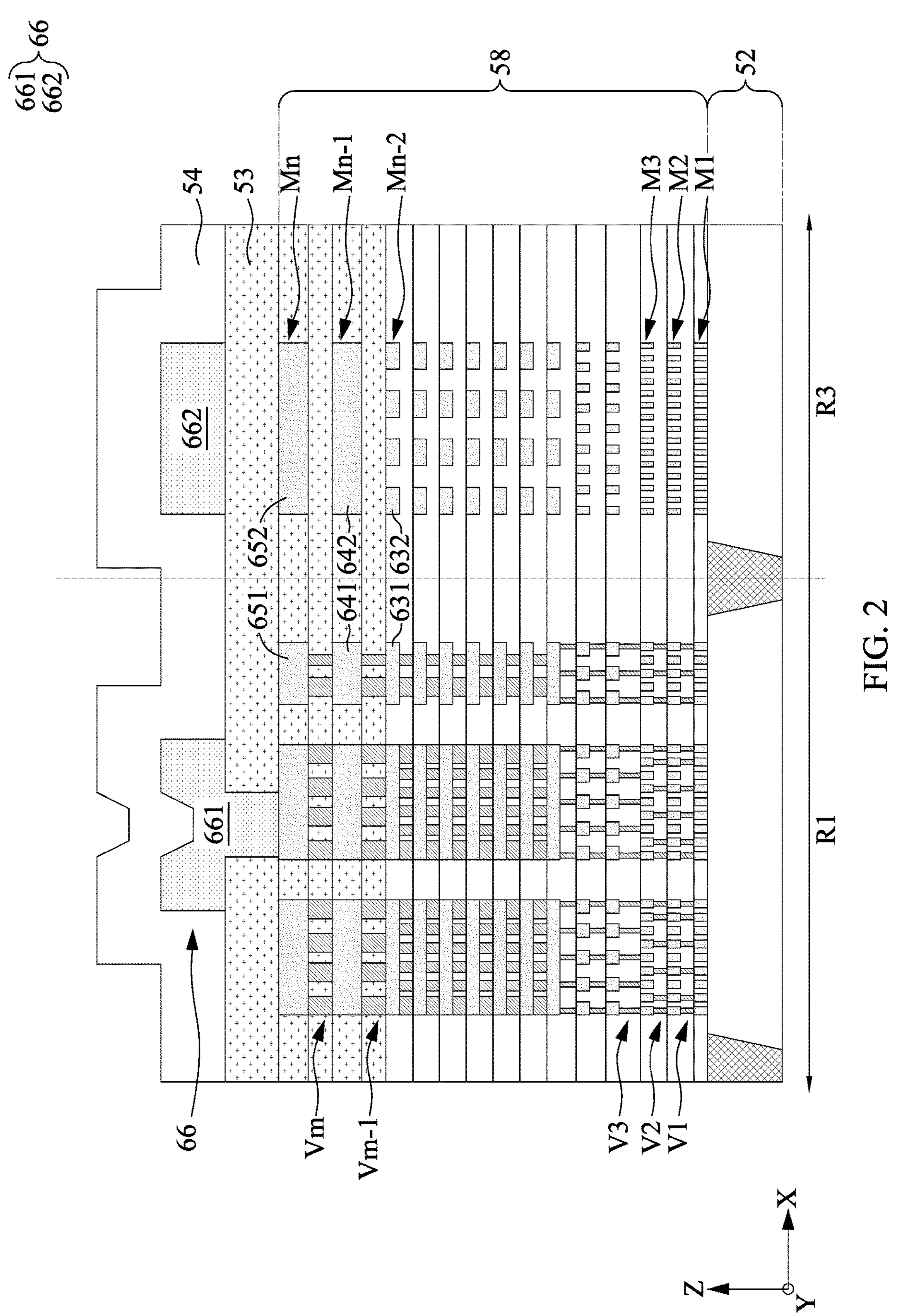
FIG. 2 is a schematic cross-sectional diagram along a line A-A' in FIG. 1 in accordance with some embodiments of the disclosure.

FIG. 1 is a top view of a semiconductor structure (or workpiece) 50 along a horizontal surface, and FIG. 2 is a cross sectional diagram of the semiconductor structure 50 along a line A-A' in FIG. 1 constructed in accordance with some embodiments. The semiconductor structure 50 includes a substrate 52. X and Y directions define a surface of the substrate 52 while Z direction defines a direction that is normal to the surface of the substrate 52. In the depicted embodiment, substrate 52 includes silicon. Alternatively, or additionally, substrate 52 includes another elementary semiconductor, such as germanium; a compound semiconductor, such as silicon carbide, gallium arsenide, gallium phosphide, indium phosphide, indium arsenide, and/or indium antimonide; an alloy semiconductor, such as SiGe, GaAsP, AlInAs, AlGaAs, GaInAs, GaInP, and/or GaInAsP; or combinations thereof. Alternatively, substrate 52 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 52 can include various doped regions depending on design requirements. For example, substrate 52 includes a p-type doped region (referred to hereinafter as a p-well), which can be configured for n-type transistors, and an n-type doped region (referred to hereinafter as an n-well), which can be configured for p-type transistors. N-type doped regions, such as n-well, are doped with n-type dopants, such as phosphorus, arsenic, other n-type dopant, or combinations thereof. P-type doped regions, such as p-well, are doped with p-type dopants, such as boron, indium, other p-type dopant, or combinations thereof. In some implementations, the substrate 52 includes doped regions formed with a combination of p-type dopants and n-type dopants. The various doped regions can be formed directly on and/or in substrate 52, for example, providing a p-well structure, an n-well structure, a dual-well structure, a raised structure, or combinations thereof. An ion implantation process, a diffusion process, and/or other suitable doping process can be performed to form the various doped regions.

The semiconductor structure 50 may include various devices (not shown) formed in or on the substrate 52, such as transistors, resistors, capacitors, inductors, other electrical devices, or a combination thereof. In some embodiments, the substrate 52 is referred to as a device layer 52. The semiconductor structure 50 can further includes an interconnect structure 58 formed over the substrate 52 and configured to couple various devices to an integrated circuit. The interconnect structure 58 includes a combination of dielectric layers and electrically conductive layers (e.g., metal layers) configured to form various interconnect features. The conductive layers are configured to form vertical interconnect features, such as device-level contacts (disposed over and electrically connecting to a gate structure) and/or vias (disposed between electrically connecting to conductive lines), and/or horizontal interconnect features, such as conductive lines. Vertical interconnect features typically connect horizontal interconnect features in different layers (or different planes) of the interconnect structure.

The interconnect structure 58 can include a plurality of metal line layers M1 to Mn, wherein n is a positive integer greater than 1. The metal line layer Mn can represent the topmost metal line layer of the interconnect structure 58. In some embodiments, the top two metal line layers Mn and Mn-1 are collectively referred to as top metal layers. In some embodiments, a metal line layer Mn-2 is a topmost metal line layer below the top metal layers. The interconnection structure 58 may further include multiple metal via layers V1 to Vm arranged alternately between the metal line layers M1 to Mn for electrical connection between the metal line layers M1 to Mn, wherein m is a positive integer greater than 1. In some embodiments, each of the metal line layers M1 to Mn is formed of metal lines and an intermetal dielectric (IMD) layer surrounding the metal lines. In some embodiments, each of the metal via layers V1 to Vm is formed of metal vias and an IMD layer surrounding the metal vias. In some embodiments, the interconnect features (including the metal lines and the metal vias) include tungsten (W), aluminum (Al), copper (Cu), silver (Ag), gold (Au), titanium (Ti), tantalum (Ta), ruthenium (Ru), tungsten (W), titanium-nitride (TiN), tantalum-nitride (TaN), ruthenium nitride (RuN), and tungsten nitride (WN), and alloy thereof. In some embodiments, the interconnect features (including metal vias and metal lines) include a same conductive material.

During operation, the interconnect features are configured to route signals between the devices and/or the components of the devices (such as a gate electrode of the transistor) and/or distribute signals (for example, clock signals, data signals, and/or ground signals) to the devices and/or the components of the devices.

The semiconductor structure 50 may also include a first passivation layer 53 and a second passivation 54 configured to provide sealing and protection effect to the integrated circuit. The passivation layers 53 and 54 include one or more suitable passivation material, such as silicon nitride, silicon oxide, other suitable dielectric material, or a combination thereof. Bonding pad layer 66 can be formed between and surrounded by the passivation layers 53 and 54. In some embodiments, the bonding pad layer 66 includes aluminum or other suitable conductive materials. In some embodiments, the bonding pad layer 66 includes a conductive material different from that of the interconnect features in the interconnect structure 58. In some embodiments, the bonding pad layer 66 includes multiple aluminum pads. It should be noted that, the passivation layers 53 and 54 and the bonding pads 66 are optional according to different applications or generations of a semiconductor structure.

As shown in FIG. 1, the semiconductor structure 50 includes a cell region (or circuit region) R1, a peripheral region R2 surrounding the cell region R1, and a logo region R3 disposed in the peripheral region R2. In some embodiments, source/drain features and gate electrodes of transistors are formed in the cell region R1. In some embodiments, passive components (such as capacitors) are formed in the peripheral region R2. The conductive features 74 and 75 for electrical connection can be seen from the top view as shown in FIG. 1. For a purpose of illustration, the conductive features 74 represent those conductive features in the cell region R1, and the conductive features 75 represent those conductive features in the peripheral region R2 outside the logo region R3. For a purpose of illustration, the peripheral region R2 represents a region surrounding the cell region R1 excluding the logo region R3.

The semiconductor structure 50 further includes a mark pattern (LOGO pattern, or identification mark) 76 formed over the substrate 52 in the logo region R3. In some embodiments, an entirety of the mark pattern 76 is disposed in the logo region R3. The mark pattern 76 is a pattern designed to identify various product-related information, such as customer information, product ID, lot ID, brand name, brand logo, and etc. The mark pattern 76 include one or more characters, such as a punctuation mark, a word, a number (such as Arabic numbers), an English letter, a symbol, a figure, or a combination thereof.

FIG. 3 shows a library of characters 78, and the mark pattern 76 can include at least one of the characters 78 shown in FIG. 3. The mark pattern 76 is collectively formed with corresponding circuit features and may be formed in a same material layer of the semiconductor structure 50. Furthermore, the conductive features 74 and 75 and the mark pattern 76 in a same layer can be defined on a same photomask; and are formed simultaneously by a same procedure that includes a lithography process using the photomask.

For example, referring back to FIGS. 1 and 2, the mark pattern 76 is formed on the first passivation layer 53 in the logo region R3. In this case, the mark pattern 76 includes a bonding pad 662 in the logo region R3, and a bonding pad 662 is formed simultaneously or concurrently with the bonding pad 661 in the cell region R1 at a same elevation (e.g., in the same bonding pad layer 66). For another example, the mark pattern 76 can be formed in the top metal layers. In some embodiments, the mark pattern 76 is formed in the metal line layer Mn in the logo region R3. In this case, the mark pattern 76 includes a metal line 652 in the logo region R3, and the metal line 652 is formed simultaneously or concurrently with a metal line 651 in the cell region R1 at a same elevation (or same level). In some embodiments, the mark pattern 76 is formed in the metal line layer Mn-1 in the logo region R3. In this case, the mark pattern 76 includes a metal line 642 in the logo region R3, and the metal line 642 is formed simultaneously or concurrently with a metal line 641 in the cell region R1 at a same elevation (or same level).

For a purpose of identification during examination, the mark pattern 76 can be formed in every metal line layers M1 to Mn and the bonding pad layer 66 if the bonding pad 662 is required. In some embodiments, the mark pattern 76 is repeatedly formed in the metal line layers M1 to Mn of the interconnect structure 58. In some embodiments, the mark pattern 76 includes product information and an indicator of the index of the metal line layer in the interconnect structure 58. For example, the mark pattern 76 in the bonding pad layer 66 includes a product ID (e.g., ABC), and the mark pattern 76 in the metal line layer M1 includes the product ID and a number (e.g., ABC_001) to indicate the first metal line layer over the substrate 52. In some embodiments, at least one character 78 is included in the mark pattern 76, and at least one character 78 of the mark patterns 76 of different layers are overlapped. In some embodiments, the at least one character 78 of the mark patterns 76 of different layers are precisely overlapped with one another.

In some embodiments, the mark pattern 76 formed below the top metal layers (e.g., in metal line layers M1 to Mn-2) are fragmented in to segments, and the segments can be collectively recognized as the mark pattern 76 (a detailed illustration is provided in the following paragraphs).

As illustrated above, the mark pattern 76 can include one or more conductive features formed concurrently or simultaneously with other conductive features in the cell region R1 and in the peripheral region R2 outside the logo region R3. In some embodiments, those conductive features of the mark pattern 76 are dummy features, which mean those conductive features of the mark pattern 76 are electrically isolated from other conductive features at the same layer or in different layers. As shown in FIG. 2, the conductive feature 652 is electrically isolated from all other conductive features and bonding pads, such as 651, 661, 662, 641, and 642. In some embodiments, each of the conductive features of the mark pattern 76 is surrounded by a dielectric material (e.g., one or more IMD layers) without electrical connection through metal vias. In some embodiments, metal vias are absent from the IMD layers in the logo region R3.

It should be noted that, for a purpose of case of recognition, only the mark pattern 76 is formed in the logo region R3, especially the mark pattern 76 formed in the bonding pad layer 66, the metal line layer Mn, and/or the metal line layer Mn-1. In other words, no other conductive features or patterns other than the mark pattern 76 are formed in the logo region R3 in the bonding pad layer 66, the metal line layer Mn, and the metal line layer Mn-1. Some dummy features for a purpose of prevention of dishing effect (e.g., resulting from a polishing operation) may be formed in the logo region R3 in other metal line layers below the top metal layers of the interconnect structure 58.

In the following descriptions, a structure and a method for making a mark pattern are provided according to various embodiments. An exemplary mark pattern including "H" is used to illustrate the structure and the method making the same. However, it is understood that this is only one example for illustration, the method and structure are also applicable to any suitable other suitable mark patterns. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to form different combinations of embodiments as long as the parameters or conditions used are not in conflict.

Referring to FIG. 4, a mark pattern 100 is illustrated. The mark pattern 100 in a design layout is transferred to a layer over the substrate 52 using a patterning process that further includes a lithography process and etching, thereby forming the mark pattern 100 on the substrate 52. In some embodiments, the mark pattern 100 includes a mark length L and a mark height H, each ranging between 1 μm and 100 μm. In the present example, the mark pattern 100 includes one or more portion 102 longitudinally oriented along X direction, and portions 104 and 106 longitudinally oriented along Y direction. The portion 102, 104 or 106 includes a feature width W ranging between 0.5 μm and 50 μm. In this case, a pattern density in the logo region R3 is substantially different from a pattern density of circuit features in the cell region R1 or the peripheral region R2 outside the logo region R3. In some embodiments, a dummy pattern 200 is designed between the different portions 102, 104 and 106 of the mark pattern 100 for a purpose of prevention of dishing effect. In some embodiments, the dummy pattern 200 includes a plurality of segments evenly or randomly distributed in the IMD layer surrounding the mark pattern 100 in the logo region R3.

FIG. 5 is a schematic top view of the mark pattern 100 and the dummy pattern 200 being transferred to a conductive layer over the substrate 52 using a photomask including the mark pattern 100 and the dummy pattern 200 in accordance with some embodiments of the present disclosure. In some embodiments, the mark pattern 100 including rounded corners are formed due to a rounding effect of the lithography process. The letter "H" of the mark pattern 100 can be recognized under an ordinary manufacturing process.

FIG. 6 is a schematic top view of the mark pattern 100 and the dummy pattern 200 being transferred to a conductive layer over the substrate 52 using a photomask including the mark pattern 100 and the dummy pattern 200 in accordance with a comparative embodiment of the present disclosure. In the comparative embodiments, the mark pattern 100 is damaged during the manufacturing process (e.g., the conductive feature of the mark pattern may be washed with an acidic solution, and can be damaged), and recognition of the letter "H" of the mark pattern 100 can be difficult. The presence of the dummy pattern 200 may interfere the recognition of the mark pattern 100 or make the recognition of the mark pattern 100 even more difficult when the mark pattern 100 is damaged.

Referring to FIG. 7, a mark pattern 100 provided in FIG. 7 without a dummy pattern (e.g., the dummy pattern 200 shown in FIG. 4) on a photomask in a region corresponding to the logo region R3 in accordance with some embodiments of the present disclosure. In some embodiments, when a circuit layout including the mark pattern 100 and the dummy pattern 200 as shown in FIG. 4, the dummy pattern 200 is removed manually or by program to generate a modified circuit layout without the dummy pattern 200. In some embodiments, the modified circuit layout is used in a circuit fabrication to form the mark pattern 100 as shown in FIG. 8 or 9 on a conductive layer over the substrate 52. In some embodiments, the mark pattern 100 including rounded corners are formed due to the rounding effect of the lithography process as shown in FIG. 8, and thus the letter "H" of the mark pattern 100 can be easily recognized. In some embodiments, the mark pattern 100 is damaged as shown in FIG. 9, and the letter "H" of the mark pattern 100 can still be recognized without the presence of the dummy pattern 200.

Figure 10:
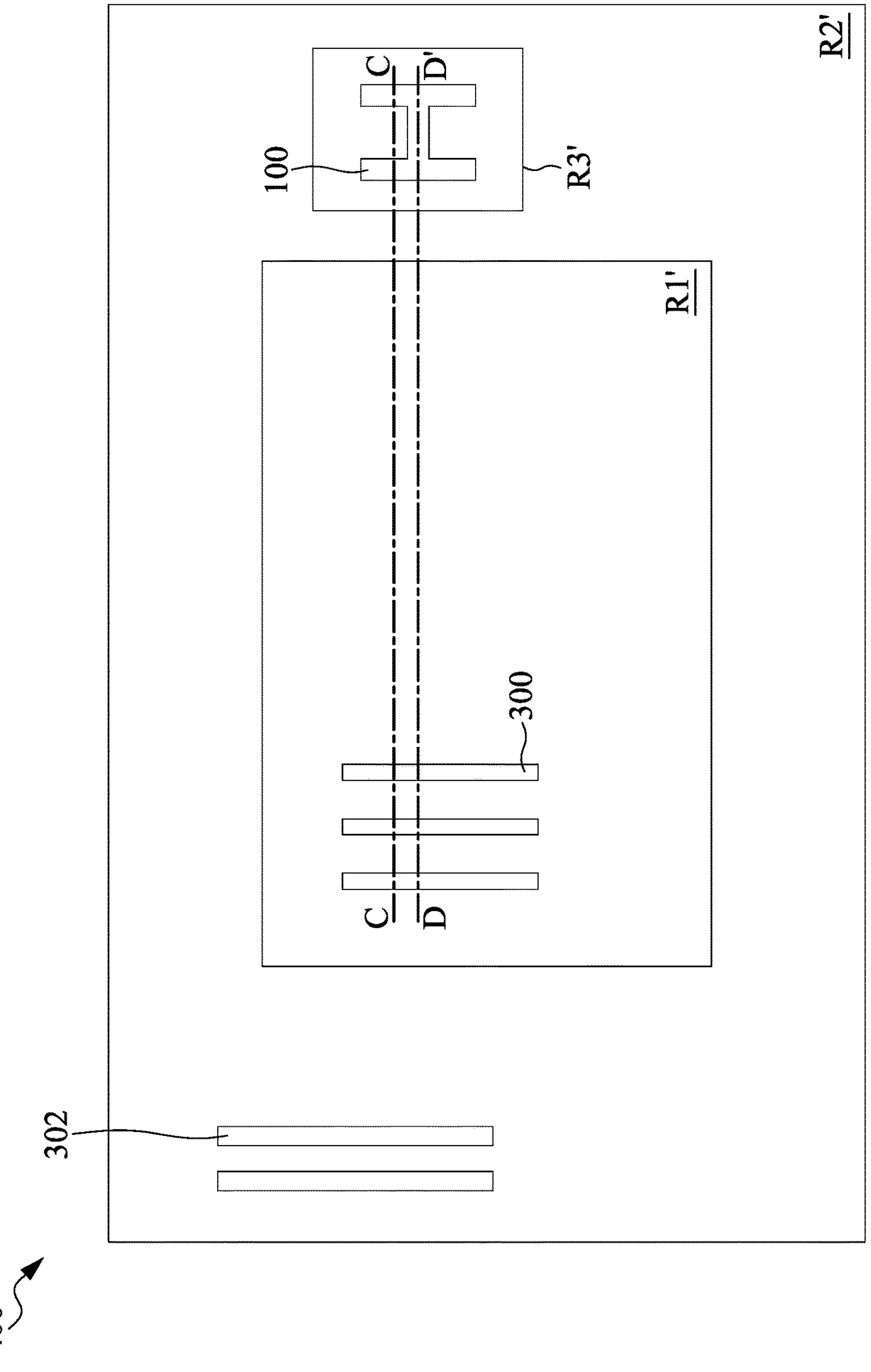
FIG. 10 is a schematic diagram of a circuit layout, a photomask or a semiconductor structure in accordance with some embodiments of the present disclosure.

FIG. 10 is a schematic top view of a circuit layout 400 showing different patterns in different regions of the circuit layout 400 in accordance with some embodiments of the present disclosure. The circuit layout 400 includes a circuit pattern 300 in a cell region R1', a contact pattern 302 in a peripheral region R2', and a mark pattern 100 in the logo region R3'. The cell region R1', the peripheral region R2' and the logo region R3' of the circuit layout 400 correspond to the cell region R1, the peripheral region R2 and the logo region R3, respectively, of a semiconductor structure (e.g., the semiconductor structure 50 in FIG. 1). The circuit pattern 300, the contact pattern 302 and the mark pattern 100 are to be formed on a same material layer over a substrate (e.g., the substrate 52). The circuit pattern 300 is distant from the mark pattern 100. The circuit layout 400 does not include a dummy pattern (e.g., the dummy pattern 200 in FIG. 4) in the logo region R3'.

In some embodiments, the circuit layout 400 without a dummy pattern 200 is received. In some embodiments, a photomask is formed according to the circuit layout 400, wherein the photomask includes the circuit pattern 300, the contact pattern 302, and the mark pattern 100 shown in FIG. 10. In some embodiments, the top view shown in FIG. 10 can represent a top view of a photomask since the photomask is constructed from the circuit layout. In some embodiments, the top view shown in FIG. 10 can represent a top view of an intermediate surface or a top surface of a semiconductor structure since a conductive layer of the semiconductor structure is patterned according to the photomask having circuit layout. In some embodiments, a circuit layout having a dummy pattern 200 in the logo region R3' (the circuit layout can be similar to the circuit layout 400 shown in FIG. 10 but having the mark pattern 100 and the dummy pattern 200 as shown in FIG. 4 in the logo region R3'), and a removal of the dummy pattern 200 is performed. In some embodiments, the circuit layout is examined, and the dummy pattern 200 in the logo region R3' is removed to generate the circuit layout 400 for circuit fabrication. The circuit layout 400 may then be transferred to a conductive layer in or over an interconnect structure as illustrated above and in FIG. 2. It should be noted dimensions and proportions of the circuit pattern 300, the contact pattern 302 and the mark pattern 100 shown in FIG. 10 are for a purpose of illustration, and the present disclosure is not limited thereto.

In some embodiments, the mark pattern 100 is transferred to multiple conductive layers over the substrate 52 in the logo region R3. For example, referring back to FIG. 2, the mark pattern 100 is transferred to at least one of the metal line layers M1 to Mn-2 below the top metal layers of the interconnect structure 58. In some embodiments, the mark pattern 100 is transferred to every of the metal line layers M1 to Mn of the interconnect structure 58. However, the mark pattern 100 formed on the substrate 52 includes various dimensions that are usually substantially greater than those of the circuit features formed in the same layer over the substrate 52. Especially for those of the circuit features in the cell region R1 in the metal line layers close to the substrate 52 or below the top metal layers, a size difference between the circuit features in the cell region R1 and the mark pattern 100 in the logo region R3 can be dramatic.

In this case, a local pattern density of the mark pattern 100 in the logo region R3 is substantially different from a local pattern density of the circuit features in the cell region R1. Especially, the local pattern density in the region where the presence of the mark pattern 100 is not uniform. For example, some areas of the mark pattern 100 have a local pattern density close to 0% and some areas of the mark pattern 100 have a local pattern density close to 100%. This uneven pattern density will cause fabrication issues, such as an uneven loading effect of subsequent process(es) (etching, chemical mechanical polishing (CMP), other processes or a combination thereof). This uneven loading effect reduces the process window and degrade the fabrication quality.

Referring to FIG. 11, a mark pattern 120 is illustrated in FIG. 11. In some embodiments, the mark pattern 120 includes a plurality of segments 121, and the plurality of segments 121 together can be recognized as the mark pattern 100 (presented by a dotted contour). In some embodiments, in order to form the mark pattern 120 having an edge profile being substantially identical or similar to the mark pattern 100 shown in FIG. 7, an original mark pattern in an original layout is identical to or the same as the mark pattern 100 in FIG. 7 and is therefore presented in FIG. 11 by the dotted contour 100. In some embodiment, the original mark pattern is received and fragmented to generate a fragmented mark pattern (modified mark pattern) 120, which includes a plurality of segmental features (or derived features) 121. In some embodiments, the segmental features 121 are straight lines configured in parallel and are longitudinally oriented along a same direction as shown in FIG. 11. However, the present disclosure is not limited thereto. The segmental features 121 can be tiled lines, waved lines, blocks, or other configurations depending on different applications. The segmental features 121 collectively represent the original mark pattern (e.g., the mark pattern 100) and are recognizable as the original mark pattern. From another perspective, by filling the gaps between the segmental features 121, the segmental features 121 can be recognized or interpreted as the mark pattern 100.

The fragmentation of the original mark pattern 100 may be achieved by any suitable method, such as by removing portions of the received mark pattern 100 based on an instruction or automatically. In some embodiments, the modified mark pattern 120 is generated by abstracting portions of the original mark pattern 100. In furtherance of the embodiment, the segmental features 121 of the modified mark pattern 120 are configured in a periodic structure. Each of the segmental features 121 is designed to have a same width W1, and the segmental features 121 include a uniform spacing S1 and a uniform pitch P1 between one another. The width W1, spacing S1 and pitch P1 span along a direction being orthogonal to the longitudinal direction of the derived mark features. The pitch P1 is defined as a periodic dimension from one segmental feature 121 to an adjacent segmental feature 121. The pitch P1 may be related to the width W1 and spacing S1 by P1=W1+S1. By tuning the dimensions P1 and W1 (or S1 and W1), the pattern density of the modified mark pattern 120 can be tuned according to a conductive layer to be patterned. The ratio W1/P1 may determine a local pattern density. When the ratio W1/P1 is reduced, such as by reducing W1, increasing P1 or a combination thereof, the local pattern density is reduced. When the ratio W1/P1 is increased, such as by reducing P1, increasing W1 or a combination thereof, the local pattern density is increased. In some embodiments, the modified mark pattern 120 is to be transferred to one of the metal line layers M1 to Mn-2, wherein W1 ranges between 0.001 μm and 2 μm, and S1 ranges between 0.001 μm and 2 μm. An orientation of the segmental features 121 also provides design freedom to adapt to various process effects, such as pattern uniformity or lithography process.

Figure 13:
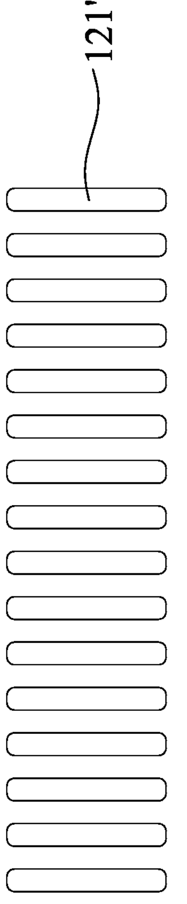
FIG. 13 is a schematic cross section of the conductive features 121' along a line B-B' in FIG. 12 in accordance with different embodiments of the present disclosure.
Figure 13:
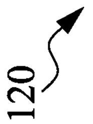
Figure 13:
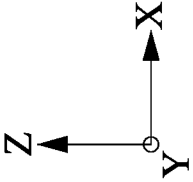

The derived mark pattern 120 is then transferred to a conductive layer over the substrate 52 by a patterning process (such as lithography and etching), thereby forming a plurality of conductive features 121' from the conductive layer. As shown in FIGS. 12 and 13, a configuration of the conductive features 121' from a top view is shown in FIG. 12, and a cross section of the conductive features 121' along a line B-B' in FIG. 12 is shown in FIG. 13.

The absence of a dummy pattern or dummy features (e.g., the dummy pattern 200 in FIG. 4) can improve recognition of the mark pattern 100. An electrical property or product performance will not be affected in the absence of a dummy pattern in the logo region R3 for the following reasons. First of all, the mark pattern 100 is formed in the logo region R3, which includes only dummy features formed therein. Therefore, even the dishing effect occurs due to the absence of the dummy pattern 200, the product yield is not affected. Secondly, the absence of the dummy pattern can be applied only in a few top layers (or top metal layers) of the semiconductor structure 50 (e.g., the bonding pad layer 66 and the top metal layers, such as Mn and Mn-1) for a purpose of case of recognition of the semiconductor structure 50. In some embodiments, the dummy pattern is absent from the logo region R3 in the metal line layer Mn-1 and layers thereover, and is applied in the logo region R3 in the conductive layers below the top metal layers to minimize the possibility of a dishing effect and also to achieve the purpose of case of recognition. In some embodiments without the dummy pattern, the space in the logo region R3 other than the mark pattern 100 in the same layer is filled with dielectric material (e.g., of an IMD layer). However, the present disclosure is not limited thereto. In some embodiments, the dummy pattern is absent in all metal line layers M1 to Mn.

Referring FIG. 14, a top view of a plurality of conductive features 121' is shown together with a plurality of dummy features 221'. In some embodiments, a photomask constructed according to a circuit layout including a dummy pattern 220 and a mark pattern 120 in a logo region R3 is provided. In some embodiments, the dummy pattern 220 and the mark pattern 120 are transferred to a conductive layer over the substrate 52, thereby forming the mark pattern 120 including the conductive features 121' and the dummy pattern 220 including the dummy features 221' as shown in FIG. 14. It should be noted that the conductive features 121' can be formed by a single patterning process, a double patterning process, or other suitable manufacturing technique depending one a dimension of the conductive features 121'.

The conductive features 121' can be formed by two photomasks. In some embodiments as shown in FIGS. 15 to 16, a first photomask including a first mark pattern 122 is provided, and a second photomask including a second mark pattern 124 is provided. The first mark pattern 122 may include a plurality of segments 123, and the second mark pattern 124 may include a plurality of segments 125. The first mark pattern 122 and the second mark pattern 124 can be combined to provide the mark pattern 120 having a profile identical or similar to the mark pattern 100 (as indicated by a dotted contour) as shown in FIG. 17. It should be noted that FIG. 17 is shown only for a purpose of illustration of a final pattern to be formed on a conductive layer over the substrate 52.

Figure 18:
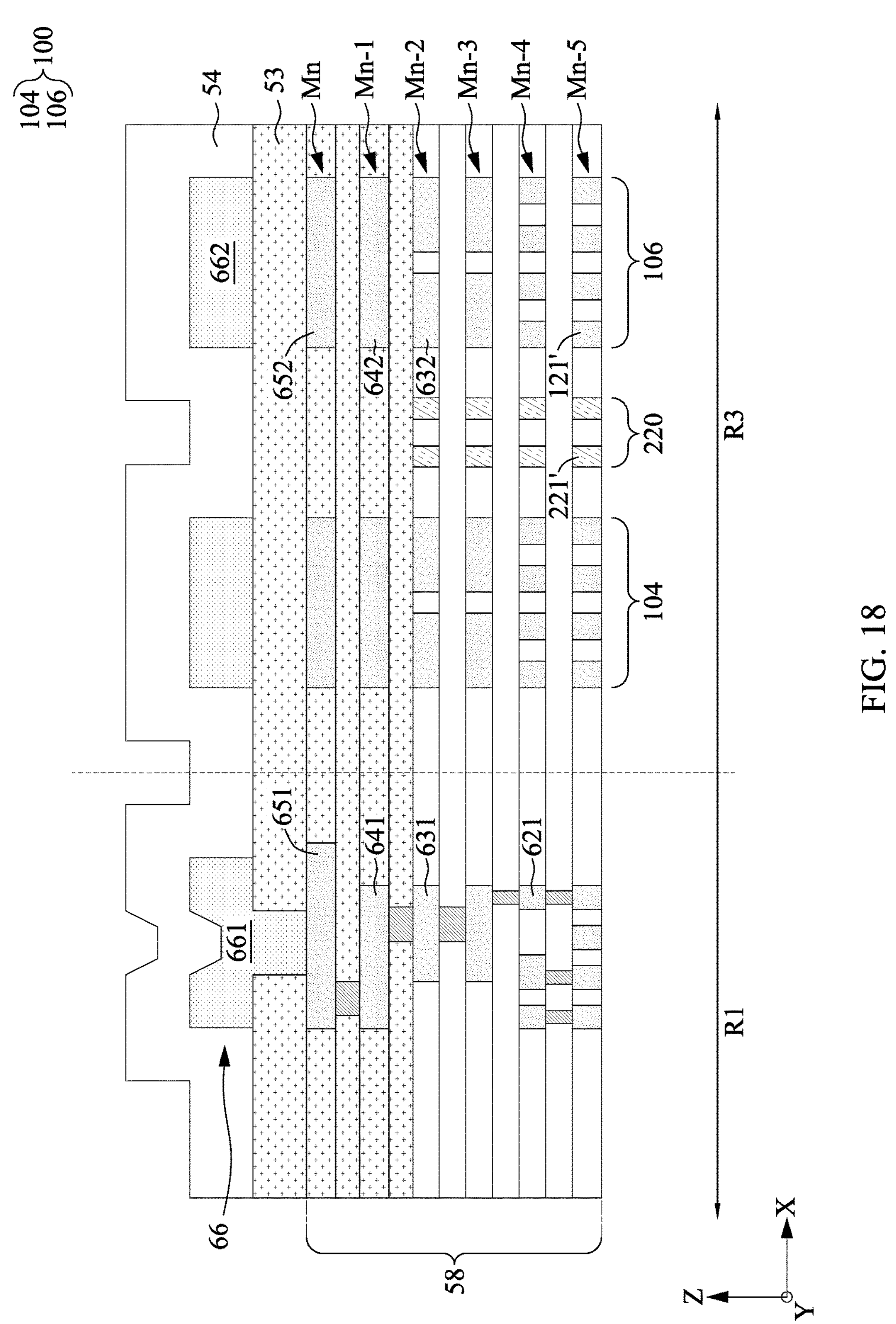
FIG. 18 is a schematic cross-sectional diagram of a portion of a semiconductor structure in accordance with some embodiments of the present disclosure.

FIG. 18 shows a schematic cross section of a portion of a semiconductor structure including dummy features of a dummy pattern and conductive features of a mark pattern in accordance with some embodiments of the present disclosure. In some embodiments, the cross section of FIG. 18 is drawn along a line C-C' in FIG. 10 when FIG. 10 is a top view of a semiconductor structure. The semiconductor structure of FIG. 10 can have a cross sectional structure similar to the semiconductor structure 50 shown in FIG. 2 but having the dummy features in the logo region R3. In some embodiments, the mark pattern 100 is formed in every metal line layers (only Mn to Mn-5 are depicted in FIG. 18) and in the bonding pad layer 66. In some embodiments, the pattern shown in FIG. 7 is transferred to the bonding pad layer 66, the metal line layer Mn and the metal line layer Mn-1. In some embodiments, the metal line layers Mn-4 and Mn-5 are patterned to have a top view similar to that shown in FIG. 14.

As shown in FIG. 18, the dummy features 221' of the dummy pattern 220 are formed between different portions 104 and 106 of the mark pattern 100. In some embodiments, the dummy features 221' of the dummy pattern 220 is absent in the top metal layers Mn and Mn-1 and the bonding pad layer 66. In addition, a number of segmental features of the portions 104 and 106 of the mark pattern 100 can be different in different metal line layers. For instance, each of the portions 104 and 106 of the mark pattern 100 in the metal line layer Mn-2 or Mn-3 includes two segmental features 632 from the cross section shown in FIG. 18. For another instance, each of the portions 104 and 106 of the mark pattern 100 in the metal line layer Mn-4 or Mn-5 includes four segmental features 121' from the cross section shown in FIG. 18. In some embodiments, the metal line layers Mn-4 and Mn-5 are closer to the substrate 52 (not shown in FIG. 18) disposed there beyond, and a dimension of circuit features (e.g., 621) in the cell region R1 in the metal line layers Mn-4 and Mn-5 can be smaller than a dimension of circuit features (e.g., 631) in the same cell region R1 in the metal line layers Mn-2 and Mn-3. Therefore, the dimension of each of the segmental features in the metal line layers Mn-4 and Mn-5 in the logo region R3 is smaller than the dimension of each of the segmental features in the metal line layers Mn-2 and Mn-3 in the logo region R3. In some embodiments, the number of the segmental features is inversely proportional to the dimension of the segmental features. A number and a dimension of the segmental features of the mark pattern 100 in different layers can be adjusted according to different requirements to optimize a manufacturing result.

Figure 19:
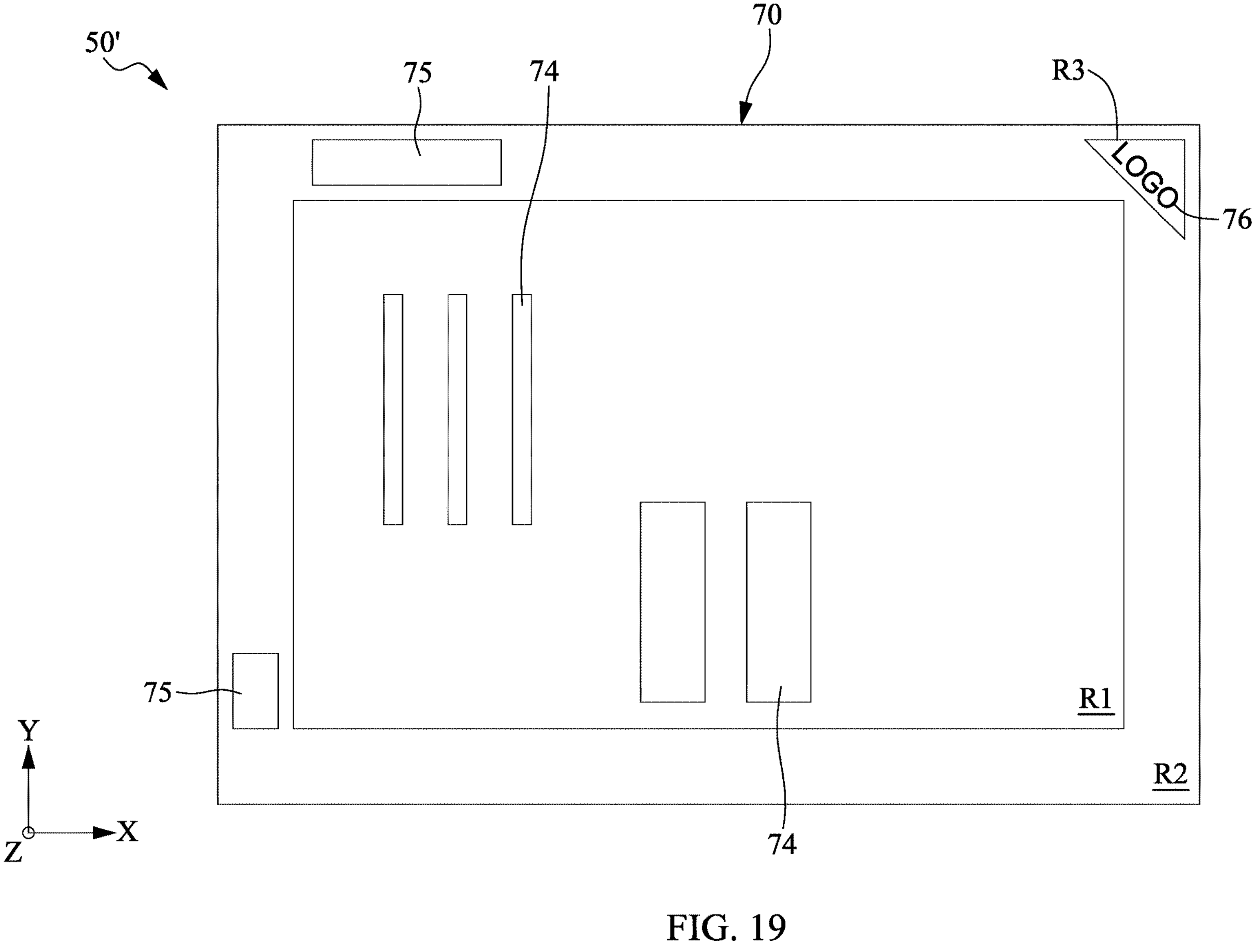
FIG. 19 is a schematic top view of a semiconductor structure in accordance with some embodiments of the disclosure.

FIG. 19 is a top view of a semiconductor structure (or workpiece) 50' along a horizontal surface in accordance with some embodiments. A position of a logo region R3 in a peripheral region R2 can be adjusted according to different applications. In some embodiments, the logo region R3 is along a sidewall of the semiconductor structure 50 as shown in FIG. 1. In some embodiments, the logo region R3 is at a corner of the semiconductor structure 50' as shown in FIG. 19.

Figure 20:
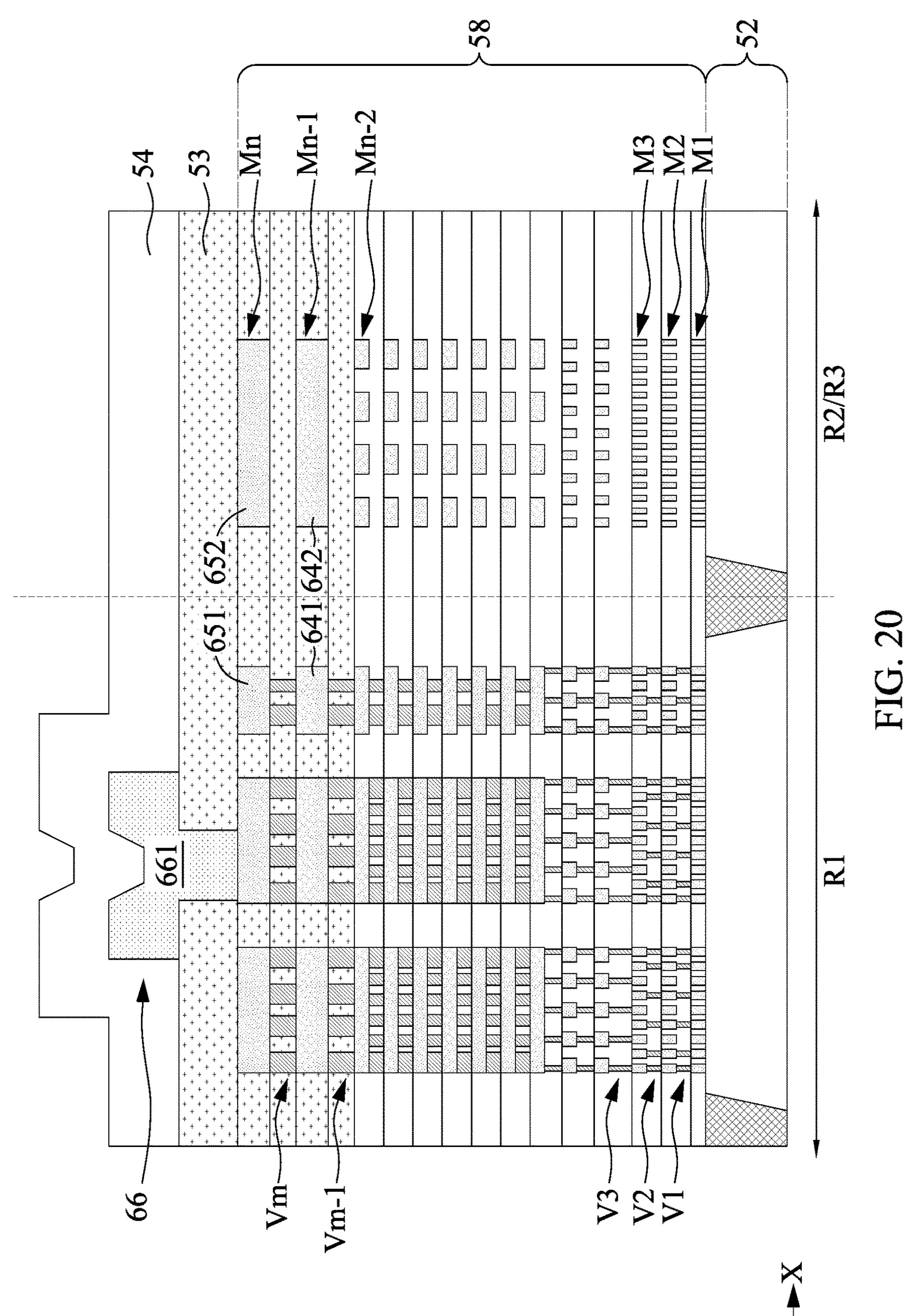
FIG. 20 is a schematic cross-sectional diagram of a semiconductor structure in accordance with some embodiments of the disclosure.

FIG. 20 is a cross sectional diagram of a semiconductor structure in accordance with some embodiments of the present disclosure. A difference between the embodiments shown in FIGS. 2 and 20 is the bonding pad 662 in FIG. 2 is absent in FIG. 20. In other words, none of the bonding pads in the bonding pad layer 66 overlaps the mark patterns 100 in the underlying layers of the interconnect structure 58. In some embodiments, the mark patterns 100 in the metal line layers M1 to Mn of the interconnect structure 58 are separated from the bonding pads in the bonding pad layer 66 from a top view perspective. In some embodiments, the mark pattern 100 in the topmost metal line layer Mn can be recognized through the passivation layers 53 and 54. In some embodiments, the bonding pad layer 66 is a patterned layer and exposes an entirety of the mark pattern 100 in the topmost metal line layer Mn. In some embodiments, the passivation layer 53 contacts an entirety of a top surface of the mark pattern 100 in the topmost metal line layer Mn. In some embodiments, the cross section of FIG. 20 or FIG. 2 is drawn along a line D-D' in FIG. 10 when FIG. 10 is a top view of a semiconductor structure.

To conclude the processes of different embodiments as described above, a method 700 and a method 800 within a same concept of the present disclosure are provided.

Figure 21:
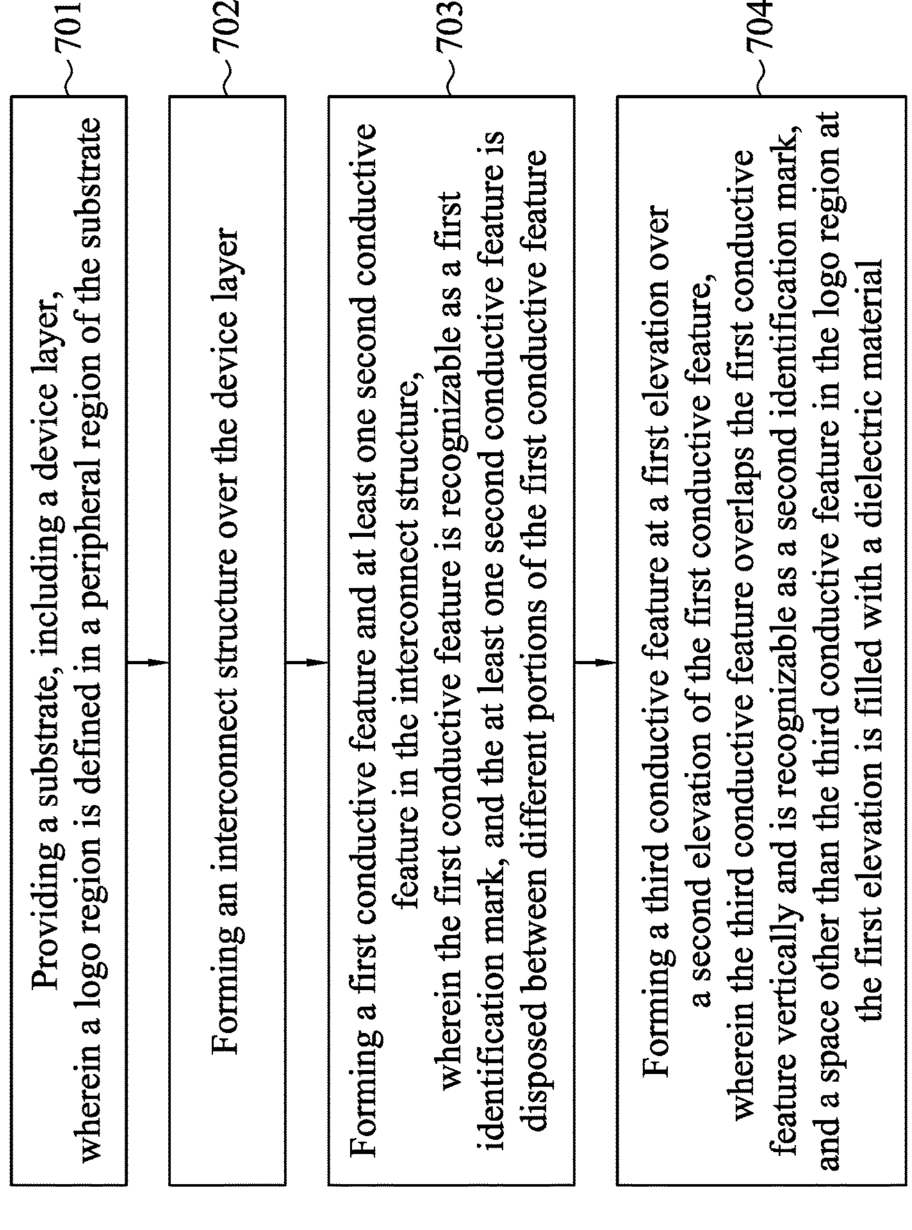
FIG. 21 is a flow diagram of a method of manufacturing a semiconductor structure in accordance with different embodiments of the present disclosure.

FIG. 21 is a flow diagram of the method 700 for manufacturing a semiconductor structure in accordance with some embodiments of the present disclosure. The method 700 includes a number of operations (701, 702, 703 and 704), and the description and illustration are not deemed as a limitation to the sequence of the operations. In the operation 701, a substrate is provided, wherein the substrate includes a device layer, and a logo region is defined in a peripheral region of the substrate. In the operation 702, an interconnect structure is formed over the device layer. In the operation 703, a first conductive feature and at least one second conductive feature are formed in the interconnect structure, wherein the first conductive feature is recognizable as a first identification mark, and the at least one second conductive feature is disposed between different portions of the first conductive feature. In the operation 704, a third conductive feature is formed at a first elevation over a second elevation of the first conductive feature, wherein the third conductive feature overlaps the first conductive feature vertically and is recognizable as a second identification mark, and a space other than the third conductive feature in the logo region at the first elevation is filled with a dielectric material.

Figure 22:
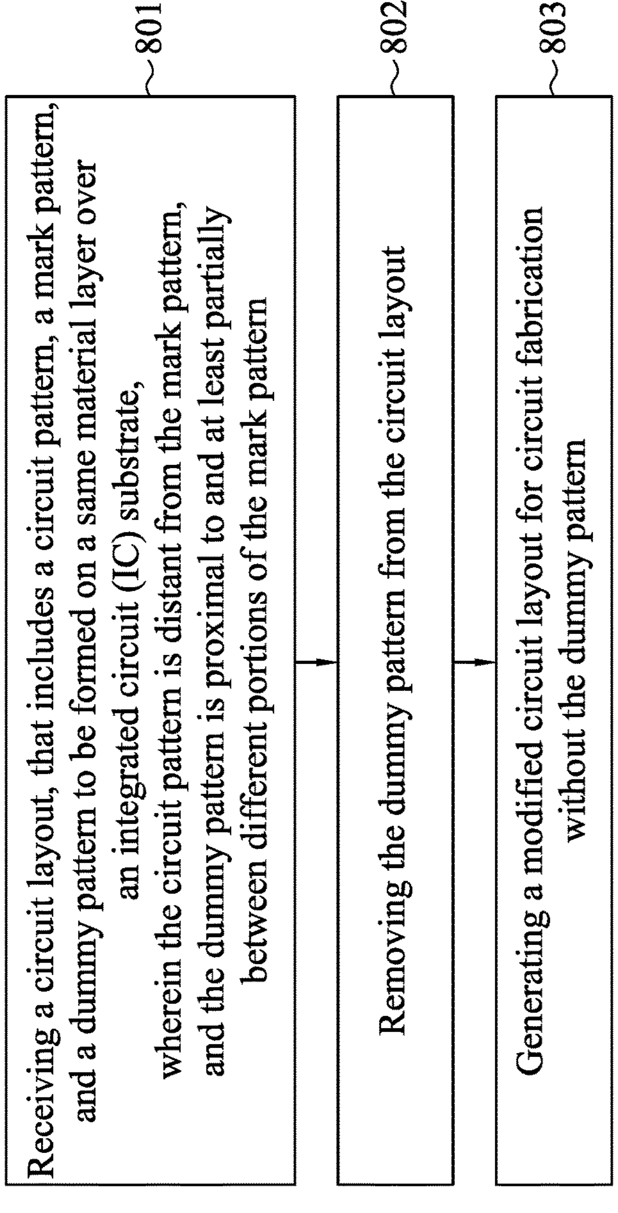
FIG. 22 is a flow diagram of a method of manufacturing a semiconductor structure in accordance with different embodiments of the present disclosure.

FIG. 22 is a flow diagram of the method 800 for manufacturing a semiconductor structure in accordance with some embodiments of the present disclosure. The method 800 includes a number of operations (801, 802 and 803), and the description and illustration are not deemed as a limitation to the sequence of the operations. In the operation 801, a circuit layout is received, wherein the circuit layout includes a circuit pattern, a mark pattern, and a dummy pattern to be formed on a same material layer over an integrated circuit (IC) substrate; the circuit pattern is distant from the mark pattern; and the dummy pattern is proximal to and at least partially between different portions of the mark pattern. In the operation 802, the dummy pattern is removed from the circuit layout. In the operation 803, a modified circuit layout is generated for circuit fabrication without the dummy pattern.

It should be noted that the operations of the method 700 and/or the method 800 are able to be rearranged or otherwise modified within the scope of the various aspects. In some embodiments, additional processes are provided before, during, and after the method 700 and/or the method 800, and some other processes are only briefly described herein. Thus, other implementations are possible within the scope of the various aspects described herein.

In accordance with some embodiments of the disclosure, a method for manufacturing a semiconductor structure is provided. The method may include several operations. A substrate is provided, wherein the substrate includes a device layer, and a logo region is defined in a peripheral region of the substrate. An interconnect structure is formed over the device layer. A first conductive feature and at least a second conductive feature are formed in the interconnect structure, wherein the first conductive feature can be recognized as an identification mark, and the at least second conductive feature is disposed between different portions of the first conductive feature. A third conductive feature is formed at a first elevation over a second elevation of the first conductive feature, wherein the third conductive feature overlaps the first conductive feature and can be recognized as the identification mark, and a space other than the third conductive feature in the logo region at the first elevation are filled with a dielectric material.

In accordance with some embodiments of the disclosure, a method for manufacturing a semiconductor structure is provided. The method may include several operations. A circuit layout is received, wherein the circuit layout includes a circuit pattern, a mark pattern, and a dummy pattern to be formed on a same material layer over an integrated circuit (IC) substrate; the circuit pattern is distant from the mark pattern; and the dummy pattern is proximal to and at least partially between different portions of the mark pattern. The dummy pattern is removed from the circuit layout. A modified circuit layout is generated for circuit fabrication without the dummy pattern.

In accordance with some embodiments of the disclosure, a semiconductor structure is provided. The semiconductor structure includes: a substrate, a first metal layer and a second metal layer. The substrate includes a cell region, a peripheral region surrounding the cell region, and a logo region in the peripheral region. The first metal layer is disposed over the substrate and comprises: a first conductive feature, a second conductive feature, and a third conductive feature. The first conductive feature is in the cell region. The second conductive feature is in the logo region, wherein the second conductive feature can be identified as a symbol selected from a group consisting of a punctuation mark, a word, a letter, a number, and a combination thereof. The third conductive feature is in the logo region adjacent to the second conductive feature, wherein the third conductive is disposed between different portions of the second conductive feature without a meaningful pattern. The second metal layer is disposed over the first metal layer and comprises: a fourth conductive feature, a fifth conductive feature, and a dielectric layer. The fourth conductive feature is in the cell region, electrically connecting the first conductive feature. The fifth conductive feature is in the logo region, overlapping the second conductive feature, wherein the fifth conductive feature can be identified as the symbol. The dielectric layer surrounds the fifth conductive feature, wherein a portion of the second metal layer in the logo region consists of the third conductive feature and a portion of the dielectric layer.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:

providing a substrate, including a device layer, wherein a logo region is defined in a peripheral region of the substrate;

forming an interconnect structure over the device layer;

forming a first conductive feature and at least one second conductive feature in the interconnect structure, wherein the first conductive feature is recognizable as a first identification mark, and the at least one second conductive feature is disposed between different portions of the first conductive feature; and forming a third conductive feature at a first elevation over a second elevation of the first conductive feature, wherein the third conductive feature overlaps the first conductive feature vertically and is recognizable as a second identification mark, and a space other than the third conductive feature in the logo region at the first elevation is filled with a dielectric material, wherein the first conductive feature and the at least one second conductive feature include a same conductive material, and the third conductive feature includes a conductive material different from that of the first conductive feature.

2. The method of claim 1, wherein the first identification mark includes a first character, the second identification mark includes a second character, and the first character and the second character have a same configuration and vertically overlap one another.

3. The method of claim 1, wherein the first or second identification mark is selected from a group consisting of a numeral, a punctuation mark, a word, an English letter, and a combination thereof.

4. The method of claim 1, wherein the third conductive feature includes aluminum and is disposed above the interconnect structure.

5. The method of claim 1, wherein the third conductive feature is disposed in one of top two metal line layers of the interconnect structure.

6. The method of claim 5, wherein the third conductive feature is disposed in a topmost metal layer of the interconnect structure, and the method further comprises:

forming a passivation layer at a third elevation over the third conductive feature, wherein the second identification mark of the third conductive feature is recognizable through the passivation layer from a top view.

7. The method of claim 6, further comprising:

forming a plurality of conductive pads at the third elevation, wherein the plurality of conductive pads are surrounded by the passivation layer and separated from the third conductive feature from a top view.

8. The method of claim 1, wherein the interconnect structure comprises a plurality of intermetal dielectric (IMD) layers and a plurality of metal vias, and the metal vias are absent from the IMD layers in the logo region.

9. The method of claim 1, wherein the first conductive feature is disposed in a metal line layer below top two metal line layers of the interconnect structure, and the first conductive feature includes a plurality of segments parallel to one another.

10. The method of claim 1, wherein the first conductive feature is electrically isolated from the third conductive feature, and the first conductive feature and the third conductive feature are electrically isolated from all other conductive features of the substrate.

11. The method of claim 1, wherein the first conductive feature includes a first portion having a first orientation and a second portion having a second orientation, and a region between the first portion and the second portion includes no conductive materials.

12. A method for manufacturing a semiconductor structure, comprising:

receiving a circuit layout, that includes a circuit pattern, a mark pattern, and a dummy pattern corresponding to features to be formed on a same material layer over an integrated circuit (IC) substrate, wherein the circuit pattern is distant from the mark pattern, and the dummy pattern is proximal to and at least partially between different portions of the mark pattern;

removing the dummy pattern from the circuit layout;

generating a modified circuit layout for circuit fabrication without the dummy pattern;

forming a first conductive feature and at least one second conductive feature over the IC substrate, wherein the first conductive feature corresponds to the mark pattern and the at least one second conductive feature corresponds to the dummy pattern, and the first conductive feature and the at least one second conductive feature include a same conductive material; and transferring the modified circuit layout to a conductive layer over the first conductive feature to form a third conductive feature corresponding to the mark pattern, wherein the third conductive feature includes a conductive material different from that of the first conductive feature.

13. The method of claim 12, wherein the mark pattern includes a product information and an indicator of an index of the same material layer over the IC substrate.

14. The method of claim 12, wherein the conductive layer is a topmost metal line layer of an interconnect structure.

15. The method of claim 12, further comprising:

fragmenting the mark pattern to generate a fragmented mark pattern having a plurality of segments configured in parallel; and transferring the modified circuit layout to a layer of an interconnect structure.

16. A semiconductor structure, comprising:

a substrate, including a cell region, a peripheral region surrounding the cell region, and a logo region in the peripheral region;

a first metal layer, disposed over the substrate and comprising:

a first conductive feature in the cell region;

a second conductive feature in the logo region, wherein the second conductive feature is recognizable as a first identification mark; and a third conductive feature in the logo region adjacent to the second conductive feature, wherein the third conductive feature is disposed between different portions of the second conductive feature and configured as a dummy pattern; and a second metal layer, disposed over the first metal layer and comprising:

a fourth conductive feature in the cell region, electrically connected to the first conductive feature;

a fifth conductive feature in the logo region, overlapping the second conductive feature, wherein the fifth conductive feature is recognizable as a second identification mark; and a dielectric layer, surrounding the fifth conductive feature, wherein the second metal layer in the logo region consists of the fifth conductive feature and the dielectric layer, wherein the second conductive feature and the third conductive feature include a same conductive material, and the fifth conductive feature includes a conductive material different from that of the second conductive feature.

17. The semiconductor structure of claim 16, wherein the fifth conductive feature is electrically isolated from the second conductive feature.

18. The semiconductor structure of claim 16, wherein the dielectric layer in the logo region encircled the fifth conductive feature.

19. The semiconductor structure of claim 16, wherein the second conductive feature comprises a plurality of segments arranged parallel to one another.

20. The semiconductor structure of claim 16, wherein an entirety of a top surface of the fifth conductive feature is covered by the dielectric layer.

* * * * *